US006977958B1

(12) United States Patent
Hinman et al.

(10) Patent No.: US 6,977,958 B1
(45) Date of Patent: Dec. 20, 2005

(54) DIFFERENTIALLY-DRIVEN LOOP EXTENDER

(75) Inventors: Brian L. Hinman, Los Gatos, CA (US); Andrew L. Norrell, Nevada City, CA (US); James Schley-May, Nevada City, CA (US)

(73) Assignee: 2WIRE, Inc., San Jose, CA (US)

( * ) Notice: Subject to any disclaimer, the term of this patent is extended or adjusted under 35 U.S.C. 154(b) by 689 days.

(21) Appl. No.: 09/884,659

(22) Filed: Jun. 19, 2001

Related U.S. Application Data

(60) Provisional application No. 60/212,597, filed on Jun. 19, 2000, provisional application No. 60/184,392, filed on Feb. 23, 2000.

(51) Int. Cl.[7] ............................ H04B 3/36; H03H 7/30

(52) U.S. Cl. ...................... 375/211; 375/229; 379/340; 379/344

(58) Field of Search ........................ 375/211, 259, 222, 375/256–258, 229; 370/243, 293; 455/7–15; 330/255–258; 379/93.01, 340, 344, 402

(56) References Cited

U.S. PATENT DOCUMENTS

| | | | |
|---|---|---|---|
| 761,995 A | | 6/1904 | Pupin |
| 1,711,653 A | | 5/1929 | Quarles |
| 3,180,938 A | | 4/1965 | Glomb |
| 3,476,883 A | | 11/1969 | Birck et al. |
| 3,548,120 A | | 12/1970 | Tatasoff |
| 3,578,914 A | | 5/1971 | Simonelli |
| 3,848,098 A | | 11/1974 | Pinel |
| 3,873,936 A | | 3/1975 | Cho |
| 3,944,723 A | | 3/1976 | Fong |
| 3,962,549 A | | 6/1976 | Zuk |
| 4,025,737 A | | 5/1977 | Brewer |
| 4,131,859 A | | 12/1978 | Valle |
| 4,242,542 A | * | 12/1980 | Kimbrough ................. 370/293 |
| 4,259,642 A | | 3/1981 | Derby |
| 4,277,655 A | | 7/1981 | Surprenant |
| 4,392,225 A | | 7/1983 | Wortman |
| 4,462,105 A | | 7/1984 | Wagner et al. |
| 4,583,220 A | | 4/1986 | Blackburn et al. |
| 4,633,459 A | | 12/1986 | Blackburn |
| 4,656,628 A | | 4/1987 | Tan |

(Continued)

OTHER PUBLICATIONS

"Reference Data for Radio Engineers", Published by the Federal Telephone and Radio Corporation as associate of International Telephone and Telegraph Corporation, Copyright 1943, pp. 3.

(Continued)

*Primary Examiner*—Kenneth Vanderpuye
*Assistant Examiner*—Lawrence B. Williams
(74) *Attorney, Agent, or Firm*—Blakely, Sokoloff, Taylor & Zafman LLP

(57) ABSTRACT

Systems and methods are disclosed for improving DSL performance, including ADSL and VDSL performance, over a local loop between a telephone company central office and a customer premises. In particular, a loop extender is coupled to the local loop and differentially amplifies downstream and upstream DSL signals to at least partially compensate for DSL signal attenuation that occurs as DSL signals pass over the local loop. Pursuant to one embodiment, the loop extender includes an upstream filter/amplifying equalizer, a downstream filter/amplifying equalizer, a differential amplifier pair, an inverting amplifier, and a pair of electromagnetic hybrids, which couple the loop extender to the loop and provide upstream and downstream signal amplification. In another embodiment, the loop extender includes POTS loading coils to improve the POTS or voice band transmission over the local loop. According to this embodiment, the loop extender provides both improved POTS band signal transmission and DSL service.

22 Claims, 21 Drawing Sheets

U.S. PATENT DOCUMENTS

| | | | | |
|---|---|---|---|---|
| 4,667,319 A | | 5/1987 | Chum | |
| 4,766,606 A | * | 8/1988 | Bardutz et al. | 379/344 |
| 4,768,188 A | | 8/1988 | Barnhart et al. | |
| 4,788,657 A | | 11/1988 | Douglas et al. | |
| 4,970,722 A | | 11/1990 | Preschutti | |
| 5,049,832 A | | 9/1991 | Cavers | |
| 5,095,528 A | | 3/1992 | Leslie et al. | |
| 5,181,198 A | | 1/1993 | Lechleider | |
| 5,394,401 A | | 2/1995 | Patrick et al. | |
| 5,455,538 A | | 10/1995 | Kobayashi et al. | |
| 5,526,343 A | | 6/1996 | Aizawa et al. | |
| 5,623,485 A | | 4/1997 | Bi | |
| 5,678,198 A | * | 10/1997 | Lemson | 455/67.11 |
| 5,724,344 A | | 3/1998 | Beck | |
| 5,726,980 A | | 3/1998 | Rickard | |
| 5,736,949 A | | 4/1998 | Ong et al. | |
| 5,765,097 A | * | 6/1998 | Dail | 725/125 |
| 5,790,174 A | | 8/1998 | Richard, III et al. | |
| 5,822,325 A | | 10/1998 | Segaram et al. | |
| 5,825,819 A | * | 10/1998 | Cogburn | 375/257 |
| 5,859,895 A | | 1/1999 | Pomp et al. | |
| 5,892,756 A | | 4/1999 | Murphy | |
| 5,909,445 A | | 6/1999 | Schneider | |
| 5,912,895 A | | 6/1999 | Terry et al. | |
| 5,929,402 A | | 7/1999 | Charles et al. | |
| 5,974,137 A | | 10/1999 | Sheets et al. | |
| 5,991,311 A | | 11/1999 | Long et al. | |
| 6,005,873 A | | 12/1999 | Amit | |
| 6,029,048 A | | 2/2000 | Treatch | |
| 6,047,222 A | | 4/2000 | Burns et al. | |
| 6,058,162 A | | 5/2000 | Nelson et al. | |
| 6,084,931 A | | 7/2000 | Powell, II et al. | |
| 6,091,713 A | | 7/2000 | Lechleider et al. | |
| 6,091,722 A | | 7/2000 | Russell et al. | |
| 6,128,300 A | | 10/2000 | Horton | |
| 6,154,524 A | | 11/2000 | Bremer | |
| 6,188,669 B1 | | 2/2001 | Bellenger | |
| 6,195,414 B1 | | 2/2001 | Simmons et al. | |
| 6,208,670 B1 | | 3/2001 | Milliron et al. | |
| 6,226,322 B1 | * | 5/2001 | Mukherjee | 375/229 |
| 6,226,331 B1 | * | 5/2001 | Gambuzza | 375/258 |
| 6,236,664 B1 | * | 5/2001 | Erreygers | 370/492 |
| 6,236,714 B1 | | 5/2001 | Zheng et al. | |
| 6,246,695 B1 | | 6/2001 | Seaholtz et al. | |
| 6,262,972 B1 | | 7/2001 | McGinn et al. | |
| 6,263,047 B1 | | 7/2001 | Randle et al. | |
| 6,266,348 B1 | | 7/2001 | Gross et al. | |
| 6,266,395 B1 | | 7/2001 | Liu et al. | |
| 6,281,454 B1 | | 8/2001 | Charles et al. | |
| 6,343,114 B1 | | 1/2002 | Chea, Jr. | |
| 6,345,071 B1 | | 2/2002 | Hamdi | |
| 6,345,072 B1 | | 2/2002 | Liu et al. | |
| 6,351,493 B1 | | 2/2002 | Tarraf | |
| 6,370,188 B1 | | 4/2002 | Wu et al. | |
| 6,385,234 B1 | | 5/2002 | Ashley | |
| 6,385,252 B1 | | 5/2002 | Gradl et al. | |
| 6,385,253 B1 | | 5/2002 | Swisher | |
| 6,466,656 B1 | * | 10/2002 | Evans et al. | 379/93.07 |
| 6,507,606 B2 | * | 1/2003 | Shenoi et al. | 375/211 |
| 6,532,279 B1 | * | 3/2003 | Goodman | 379/90.01 |
| 6,546,100 B1 | | 4/2003 | Drew | |
| 6,681,012 B1 | * | 1/2004 | Gorcea et al. | 379/402 |
| 6,751,315 B1 | * | 6/2004 | Liu et al. | 379/413.02 |
| 2002/0001340 A1 | | 1/2002 | Shenoi et al. | |
| 2002/0061058 A1 | * | 5/2002 | Sommer | 375/213 |
| 2002/0105964 A1 | | 8/2002 | Sommer et al. | |
| 2002/0106012 A1 | * | 8/2002 | Norrell et al. | 375/222 |
| 2002/0106013 A1 | * | 8/2002 | Norrell et al. | 375/222 |
| 2002/0106076 A1 | | 8/2002 | Norrell et al. | |
| 2002/0113649 A1 | | 8/2002 | Tambe et al. | |
| 2002/0141569 A1 | * | 10/2002 | Norrell et al. | 379/377 |

OTHER PUBLICATIONS

Todd Baker, "The Challenges of Implementing", Tektronix, Oct. 1998 CTE Report, http://www.tektronix.org/Measurement/commtest/cte_reports/27/xdsl.html?view=print&page=http://ww, pp. 5.

Vince Vittore, "Telephony Making DSL go for the long run", http://industryclick.com/magazinearticle.asp?magazinearticleid=7521&magazineid=7&mode=print, Dec. 11, 2000, pp. 2.

* cited by examiner

DIFFERENTIALLY-DRIVEN LOOP EXTENDER

CROSS REFERENCE TO RELATED APPLICATIONS

This application relates to and claims the priority of commonly assigned U.S. Provisional Patent Application No. 60/212,597, entitled "DSL Repeater," filed on Jun. 19, 2000, the disclosure of which is hereby incorporated by reference. This application is also related to commonly assigned U.S. Provisional Patent Application No. 60/184,392 filed on Feb. 23, 2000 and entitled "Mid-Span Repeater for ADSL," and commonly assigned U.S. patent application Ser. No. 09/569,470 filed May 12, 2000 and entitled "DSL Repeater," the disclosures of which are hereby incorporated by reference.

BACKGROUND OF THE INVENTION

1. Field of the Invention

The present system and method relate generally to Digital Subscriber Line (DSL) technology, and more particularly to a system and method for improving ADSL (Asymmetric DSL) and VDSL (Very high data rate DSL) system performance over long local loops.

2. Description of the Background Art

One method of accessing the Internet is by using DSL technology, which has several varieties, including ADSL and VDSL versions. ADSL is one version of DSL technology that expands the useable bandwidth of existing copper telephone lines. ADSL is "asymmetric" in that ADSL reserves more bandwidth in one direction than in the other, which may be beneficial for users who do not require equal bandwidth in both directions. In one implementation, ADSL signals generally occupy the frequency band between about 25 kHz and 1.104 MHz. In this configuration, ADSL uses the frequency band between about 25 kHz and 120 kHz to transmit upstream signals (signals from a customer premises to a central office) and the frequency band between about 150 kHz to 1.104 MHz to transmit downstream signals (signals from the central office to a customer premises).

Hence, ADSL employs Frequency Division Multiplexing (FDM) to separate upstream and downstream signals and to separate ADSL signals from POTS (Plain Old Telephone Service) band signals, which reside below 4 kHz. VDSL also uses FDM to separate downstream and upstream channels as well as to separate both downstream and upstream channels from a POTS channel.

In the past, ADSL has been used to deliver high-speed data services to subscribers up to about 18,000 feet from their serving central office or central office extension. The potential data rates range from above about 8 MBPS for short loops, but drop off dramatically on long loops, such as local loops over about 18,000 feet, to about 0.5 MBPS or less. Conventionally, ADSL service generally employs a local loop length of about 6,000–14,000 feet for optimal service. Loop length is generally defined as the length of the wire between the central office, or central office extension, and the customer premises, such as a home or business. "Central office" and "central office extension" are collectively referred to herein as "central office."

DSL signals generally degrade as they traverse the local loop. Hence, the longer the local loop length, the more degraded the DSL signal will tend to be upon arriving at a central office or a customer premises. While some DSL service is conventionally possible with loop lengths longer than 14,000 feet, it has been found that with loops much longer than about 14,000 feet, the DSL signal is too degraded to provide high data transfer rates.

DSL signal degradation over a local loop may be caused, for example, by factors such as: signal attenuation, crosstalk, thermal noise, impulse noise, and ingress noise from commercial radio transmitters. The dominant impairment, however, is often signal attenuation. For example, a transmitted ADSL signal can suffer as much as 60 dB or more of attenuation on long loops, which substantially reduces the useable signal, greatly reducing potential data rates.

Additional details regarding DSL signal degradation over long loops and regarding DSL technology more generally are described in *Understanding Digital Subscriber Line Technology* by Starr, Cioffi, and Silverman, Prentice Hall 1999, ISBN 0137805454 and in DSL—*Simulation Techniques and Standards Development for Digital Subscriber Line Systems* by Walter Y. Chen, Macmillan Technical Publishing, ISBN 1578700175, the disclosures of which are hereby incorporated by reference.

SUMMARY OF THE INVENTION

A loop extender is provided along a local loop between a central office and a customer premises for amplifying DSL signals, such as Category 1 ADSL or VDSL signals, that pass between the central office and the customer premises to reduce or alleviate DSL signal degradation problems due to signal attenuation. In general, the loop extender amplifies upstream and downstream DSL signals to at least partially compensate for attenuation of the DSL signals as they traverse a local loop.

According to one embodiment, the loop extender is a non-regenerative repeater and includes an upstream filter/amplifying equalizer, a downstream filter/amplifying equalizer, a differential amplifier pair, and an inverting amplifier. The amplifiers, equalizers, and filters are disposed between a first and second electromagnetic hybrid, which provide further downstream and upstream signal amplification, respectively, and couple the loop extender to the local loop. The upstream filter/amplifying equalizer reduces or eliminates the effect of downstream signal leakage through the hybrid on the upstream signal and amplifies the upstream signal. The downstream filter/amplifying equalizer reduces or eliminates the effect of upstream signal leakage through the hybrid on the downstream signal and amplifies the downstream signal. Restated, the downstream filter/amplifying equalizer substantially prevents upstream signals from being transmitted back to the customer premises and the upstream filter/amplifying equalizer substantially prevents downstream signals from being transmitted back to the central office.

The differential amplifier pair provides further downstream signal amplification. The inverting amplifier inverts the upstream signal. The first electromagnetic hybrid is differentially driven by downstream signals, providing further downstream signal amplification and passing the downstream signal to the local loop for transmission to the customer premises. The second electromagnetic hybrid is differentially driven by upstream signals, providing further upstream signal amplification and passing the upstream signal to the local loop for transmission to the central office.

Pursuant to another aspect of the present system and method, the downstream filter/amplifying equalizer and upstream filter/amplifying equalizer are configured to amplify higher frequency signals more than lower frequency signals. Indeed, it has been found that higher frequency signals tend to be more attenuated as they pass along the local loop than do lower frequency signals. Consequently, the loop extender advantageously provides increased amplification for these higher frequency DSL signals that have been more severely attenuated than lower frequency signals.

For example, in one embodiment a downstream equalizer gain for about 80% compensation for about 6,000 feet of 26 AWG (American Wire Gauge) telephone cable is about 19 dB for 200 kHz downstream signals and about 37 dB for 1 MHz downstream signals. Likewise, in this embodiment, an upstream gain for about 80% compensation for about 6,000 feet of 26 AWG telephone cable is about 14.4 dB for 30 kHz upstream signals and about 17 dB for 110 kHz upstream signals. Different types and lengths of DSL transmission media will likely require different amounts of gain.

In accordance with yet another aspect of the present system and method, the loop extender includes a set of POTS loading coils to improve the POTS, or voice, band transmission over the local loop. Conveniently, conventional POTS loading coils may be replaced with an embodiment of the present loop extender including POTS loading coils. Hence, pursuant to this embodiment, both POTS and DSL signal transmission over a local loop may be substantially improved through the use of a loop extender.

Moreover, multiple loop extenders may be disposed in series, or in cascaded fashion, along a single local loop to amplify transmitted DSL signals multiple times as the DSL signals pass over the loop between the central office and the customer premises. By cascading multiple loop extenders in series along a single loop, DSL service may be effectively extended over local loops substantially longer than 18,000 feet. In a presently preferred embodiment, a loop extender is disposed about every 5,000–7,000 feet and preferably about every 6,000 feet along a local loop.

Accordingly, the present system and method provide for improved transmission of DSL signals over local loops. Additional features and advantages of the present system and method will be apparent to those skilled in the art from the accompanying drawings and detailed description as set forth below.

DETAILED DESCRIPTION OF THE DRAWINGS

Figure 1:
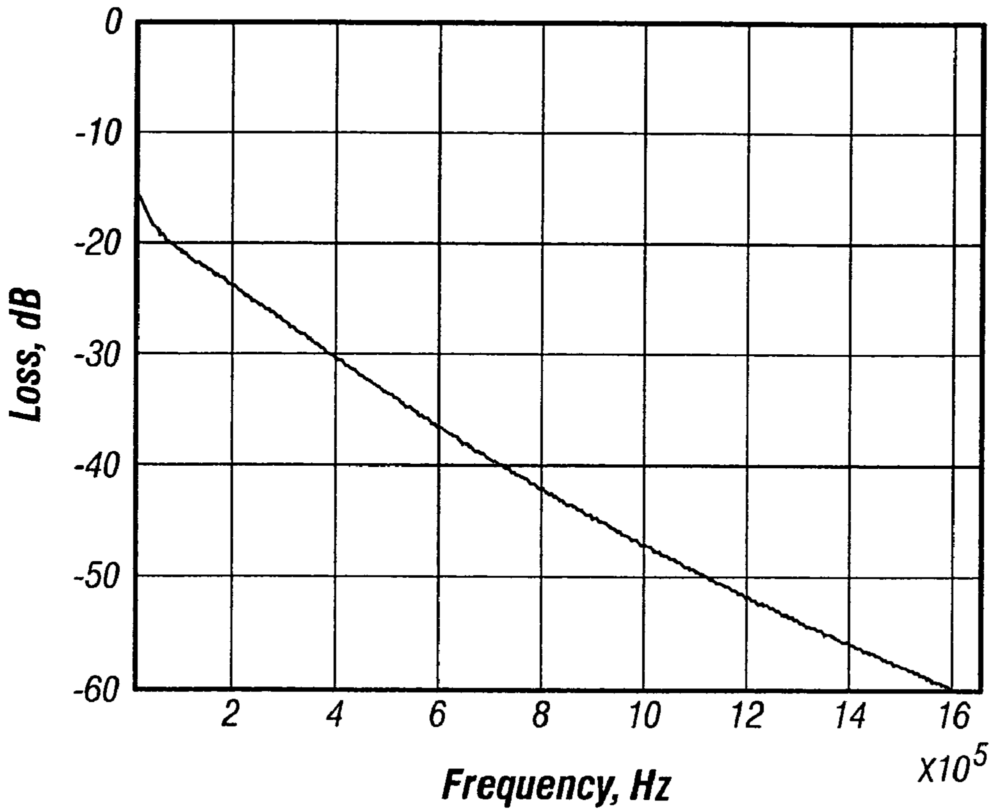
FIG. 1 is a graph illustrating one example of DSL signal attenuation over a 6,000-foot length of telephone cable as a function of signal frequency.

FIG. 1 illustrates an example of the attenuation of a DSL signal over 6,000 feet of 26 AWG (American Wire Gauge) telephone cable. As shown, higher frequency signals are generally attenuated more than lower frequency signals. In the FIG. 1 example, a 25 kHz signal is attenuated by about 25 dB over 6,000 feet of 26 AWG telephone cable while a 1 MHz signal is attenuated by about 46 dB over 6,000 feet of 26 AWG telephone cable. As those skilled in the art will appreciate, the actual degree of attenuation will also depend on factors in addition to loop length, such as temperature.

Figure 2:
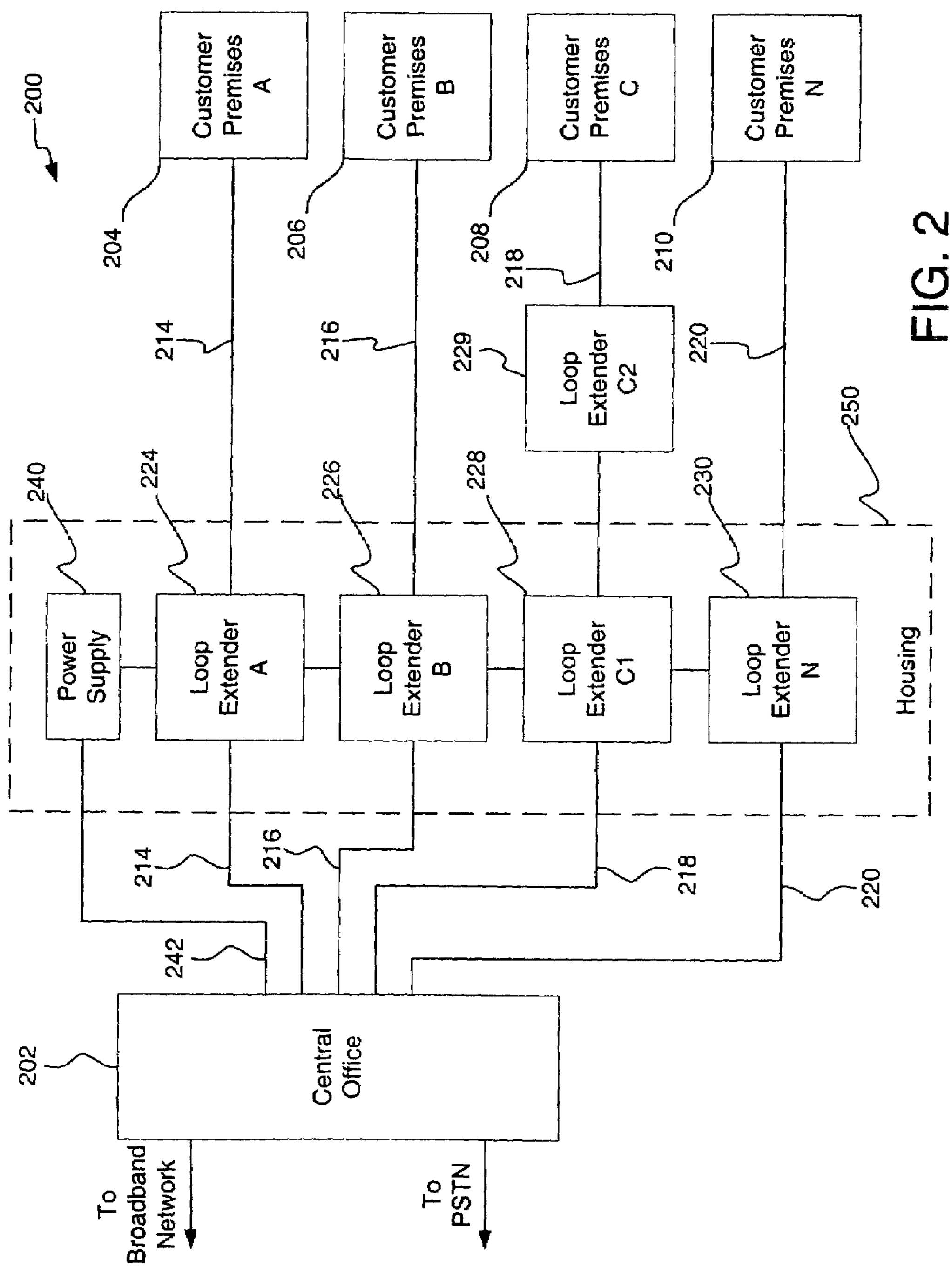
FIG. 2 illustrates multiple local loops interconnecting a central office and multiple customer premises with each local loop having at least one loop extender coupled thereto.

FIG. 2 illustrates a DSL network 200 that includes a central office 202, customer premises A 204, customer premises B 206, customer premises C 208, and customer premises N 210. The customer premises 204, 206, 208, and 210 are respectively coupled to the central office by local loops 214, 216, 218, and 220. Each local loop includes a twisted pair of copper wires; commonly known in the art as a "twisted pair." Typically, the copper wires are formed of 22, 24, or 26 AWG wire.

Moreover, as those skilled in the art will appreciate, the central office 202 and each of the customer premises 204, 206, 208, and 210 includes a DSL termination device, such as a DSL modem, for transmitting and receiving DSL signals over an associated local loop.

A loop extender 224 (also called a DSL repeater) is coupled to the local loop 214 to amplify DSL signals, such as ADSL or VDSL signals, passing over the loop 214 between the central office 202 and the customer premises 204. As discussed above, DSL signals are generally attenuated as they travel along a local loop, such as the local loop 214. The loop extender 224 is disposed along the loop 214 between the central office 202 and the customer premises 204 to at least partially compensate for the DSL signal attenuation by amplifying the transmitted DSL signals. Additional details of the loop extender 224 are described below with reference to FIGS. 3–18.

In addition, a loop extender 226 is coupled to the loop 216 between the central office 202 and the customer premises 206 to amplify DSL signals passing between the central office 202 and the customer premises 206. Likewise, a loop extender 230 is disposed between the central office 202 and the customer premises 210 to amplify DSL signals passing between the central office 202 and the customer premises 210. The loop extenders 226 and 230 are configured the same as the loop extender 224.

Further, FIG. 2 illustrates that multiple loop extenders may be coupled in series, or in cascaded fashion, to a single loop for amplifying transmitted DSL signals multiple times and in multiple locations between the customer premises and the central office to permit DSL signals to be transmitted over greater distances while still maintaining an acceptable DSL signal amplitude. Specifically, a loop extender 228 and a loop extender 229 are coupled in series to the loop 218, which couples the central office 202 and the customer premises 208. Pursuant to this configuration, the loop extender 228 first amplifies a downstream DSL signal transmitted from the central office 202 over the loop 218 to the customer premises 208 and the loop extender 229 then amplifies the downstream signal again.

Hence, the loop extender 228 amplifies the downstream signal to at least partially compensate for the attenuation incurred as the downstream signal passes over the portion of the loop 218 between the central office 202 and the loop extender 228. Next, the loop extender 229 amplifies the downstream signal to at least partially compensate for the attenuation incurred as the downstream signal passes from the loop extender 228 to the loop extender 229.

Likewise, for upstream DSL signals from the customer premises 208 to the central office 202, the loop extender 229 amplifies the upstream signals to at least partially compensate for the attenuation that occurs between the customer premises 208 and the loop extender 229. Next, the loop extender 228 amplifies the upstream signal to at least partially compensate for the attenuation incurred as the upstream signal passes from the loop extender 229 over the local loop 218 to the loop extender 228. In a preferred embodiment, the DSL signals are Category 1 ADSL signals as described in the ANSI (American National Standards Institute) T1.413 issue 2 specification in which the upstream signal band and the downstream signal band do not overlap.

In one embodiment, the loop distance between the loop extenders 228 and 229 is between about 5,000 and 7,000 feet. In a preferred embodiment, the loop distance between the loop extenders 228 and 229 is about 6,000 feet. As discussed in more detail below, this loop distance between multiple loop extenders disposed in series, in cascaded fashion, along a single loop may be advantageous in that pursuant to one embodiment of the present system and method, each loop extender may be adapted with POTS loading coils (see FIG. 4). This embodiment may then replace conventional POTS loading coils, which are disposed about every 6,000 feet along a loop to provide both POTS loading and DSL signal amplification functionality. Additional details of this embodiment are discussed below with reference to FIG. 4.

The loop 218 is illustrated as having two cascaded loop extenders 228 and 229 coupled thereto between the central office 202 and the customer premises 208. It should be noted, however, that additional loop extenders (not shown) may be disposed in series between the central office 202 and the customer premises 208 so that DSL signals may be effectively transmitted over an even longer loop 218 by being amplified multiple times by multiple loop extenders.

In the FIG. 2 embodiment, the loop extenders 224, 226, 228, and 230 receive electrical power from a power supply 240, which preferably receives power over a twisted pair 242 from the central office 202. The twisted pair 242 is a dedicated twisted pair that delivers DC current to the power supply 240 in the same manner in which electrical power is conventionally provided to T1 line repeaters. While not separately illustrated, the loop extender 229 may receive power from a separate dedicated twisted pair or may receive power from the power supply 240. Lastly, the power supply 240; the loop extenders 224, 226, 228, and 230; and associated circuitry (not shown) may be disposed in a common housing 250.

Figure 3:
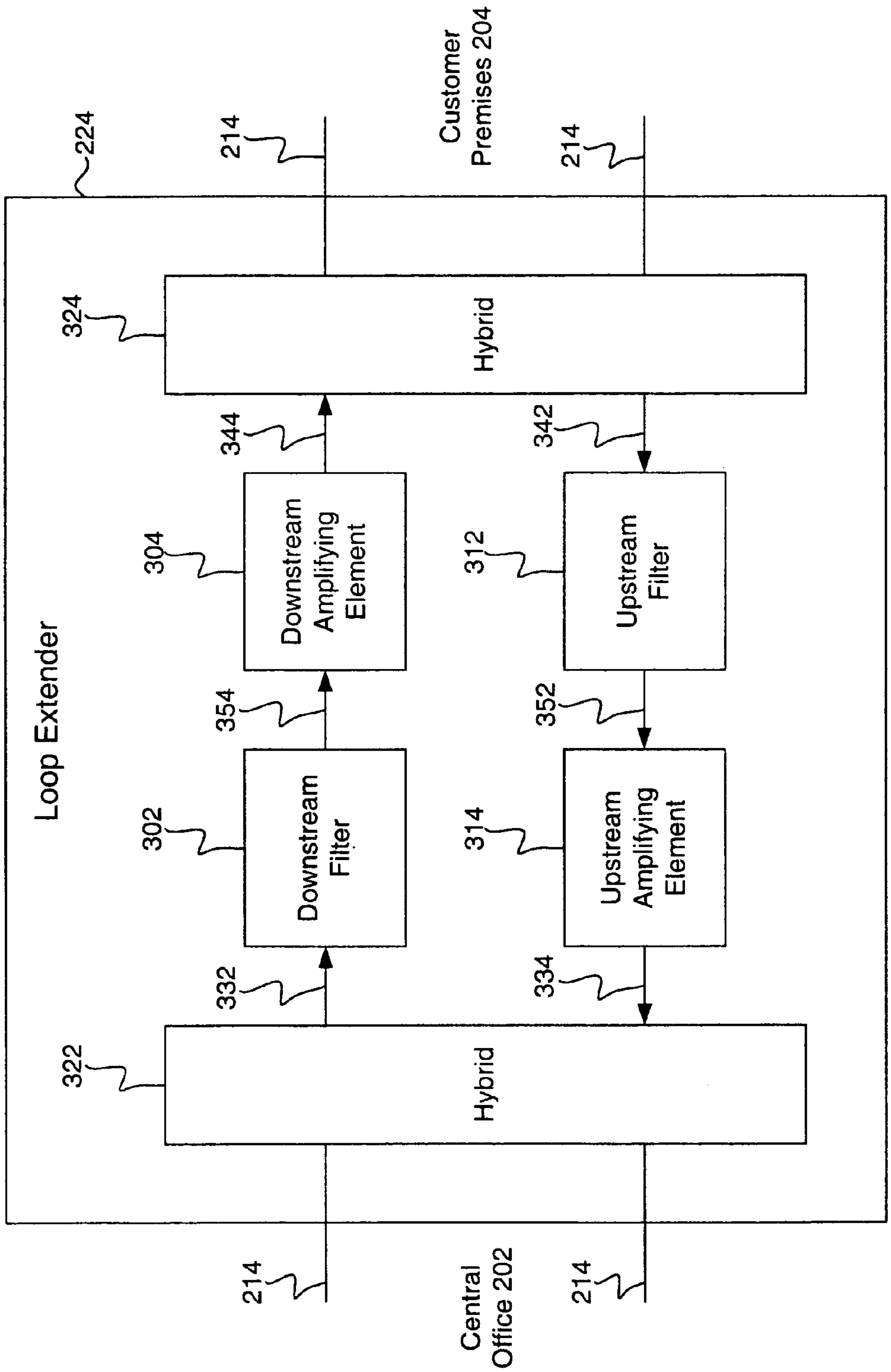
FIG. 3 illustrates one embodiment of a FIG. 2 loop extender.

FIG. 3 illustrates one embodiment of the loop extender 224 of FIG. 2. As shown, the loop extender 224 is coupled to the local loop 214 between the central office 202 and the customer premises 204. The loop extender 224 includes a downstream filter 302 and a downstream amplifying element or stage 304 and an upstream filter 312 and an upstream amplifying element or stage 314. The filters 302 and 312 and the amplifying elements 304 and 314 are disposed between a pair of hybrids 322 and 324. The amplifying elements 304 and 314 may be implemented as amplifiers or amplifying equalizers.

In general, the hybrid 322 receives downstream DSL signals from the central office 202 along the local loop 214 and outputs the downstream DSL signals to the downstream filter 302 along line 332. The hybrid 322 also receives amplified upstream DSL signals from the upstream amplifying element 314 along line 334 and transmits the upstream DSL signals onto the local loop 214 for transmission to the central office 202.

Similarly, the hybrid 324 receives upstream DSL signals from the customer premises 204 along the local loop 214 and outputs the upstream DSL signals to the upstream filter 312 along line 342. The hybrid 324 also receives amplified downstream DSL signals from the downstream amplifying element 304 along line 344 and transmits the downstream DSL signals onto the local loop 214 for transmission to the customer premises 204.

As those skilled in the art will appreciate, where the hybrid 322 is imperfect, at least a portion of the upstream amplified DSL signal received via the line 334 will leak through the hybrid 322 onto the line 332. Likewise, where the hybrid 324 is imperfect, at least a portion of the downstream amplified DSL signal received via the line 344 will leak through the hybrid 324 onto the line 342. Without the presence of the filters 302 and 312, this DSL signal leakage could cause a phenomenon known in the art as "singing," i.e., oscillations caused by introducing gain into a bi-directional system due to signal leakage.

The signal leakage problem is overcome, or substantially alleviated, through the use of the downstream filter 302 and the upstream filter 312. Category 1 ADSL upstream signals generally occupy the frequency spectrum between about 25–120 kHz and Category 1 ADSL downstream signals generally occupy the frequency spectrum between about 150 kHz –1.104 MHz. The downstream filter 302 substantially prevents leaked upstream signals from being transmitted back to the customer premises 204 by significantly attenuating signals between 25 kHz and 120 kHz for ADSL. Likewise, the upstream filter 312 is configured to provide significant attenuation to signals between about 150 kHz –1.104 MHz for ADSL. For other varieties of DSL, such as VDSL, the filters 302 and 312 respectively attenuate signals outside the downstream and upstream frequency bands, although the limits of these bands may be different than those for the ADSL variety.

In operation, the loop extender 224 receives upstream DSL signals from the customer premises 204 via the hybrid 324, filters out, or substantially attenuates, signals in the downstream frequency band with the upstream filter 312 and then passes the filtered upstream signal to the upstream amplifying element 314 via line 352 for amplification. The loop extender 224 then passes the amplified upstream DSL signal onto the loop 214 for transmission to the central office 202. Similarly, the loop extender 224 receives downstream DSL signals from the central office 202 via the hybrid 322, filters out, or substantially attenuates, signals in the upstream frequency band with the downstream filter 302 and then passes the filtered downstream signal to the downstream amplifying element 304 via line 354 for amplification. The loop extender 224 then passes the amplified downstream DSL signal onto the loop 214 for transmission to the customer premises.

Figure 4:
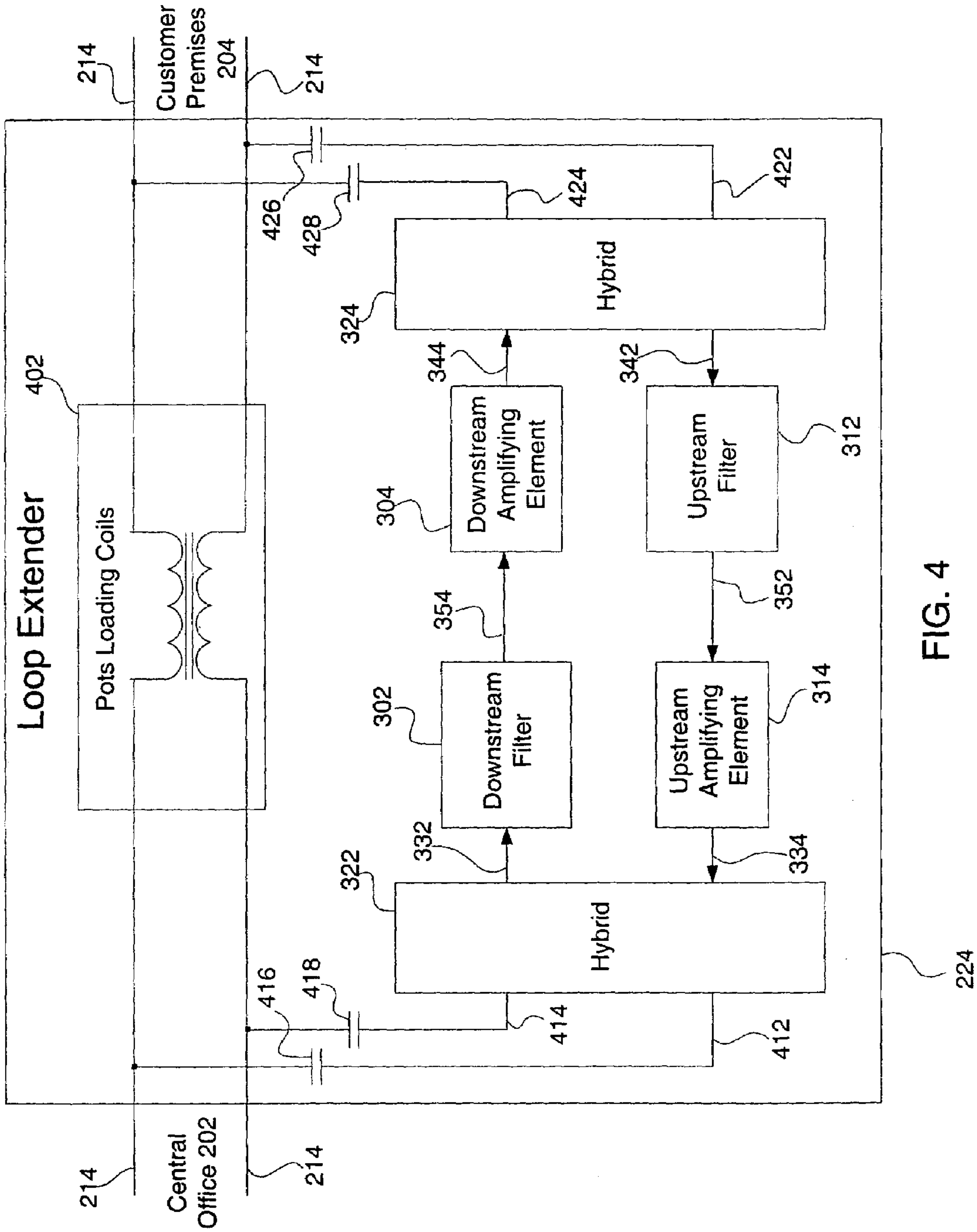
FIG. 4 illustrates another embodiment of a FIG. 2 loop extender.

FIG. 4 illustrates another embodiment of the loop extender 224, which includes POTS loading coils 402. As shown, the loop extender 224 of FIG. 4 includes POTS loading coils 402 coupled to the loop 214 to improve transmission of voice, or POTS, frequency signals over long loop lengths, such as those longer than about 18,000 feet. In one embodiment, the POTS loading coils 402 include loading coils having an inductance of about 88 mH.

The hybrid 322 is illustrated as being capacitively coupled to the local loop on the central office side of the POTS loading coils 402 along lines 412 and 414. A capacitor 416 (100 nF) is disposed along the line 412 and a capacitor 418 (100 nF) is disposed along the line 414 to capacitively couple the hybrid 322 to the loop 214 on the central office side of the POTS loading coils 402.

Similarly, the hybrid 324 is illustrated as being capacitively coupled to the local loop on the customer premises side of the POTS loading coils 402 along lines 422 and 424. A capacitor 426 (100 nF) is disposed along the line 422 and a capacitor 428 (100 nF) is disposed along the line 424 to capacitively couple the hybrid 324 to the loop 214 on the customer premises side of the POTS loading coils 402.

The loop extender 224 of FIG. 4 may be advantageously employed in circumstances where the local loop 214 already has conventional POTS loading coils coupled thereto. In this circumstance, the loop extender 224 of FIG. 4 may simply replace the conventional POTS loading coil to provide both POTS loading coil and DSL signal amplification functionality. Indeed, POTS loading coils are conventionally disposed about every 6,000 feet along some long loops to improve voice frequency transmission over long loops. By replacing these conventional POTS loading coils with the loop extender 224 of FIG. 4, a single device, namely the loop extender 224 of FIG. 4, may provide both voice frequency transmission improvement and DSL signal amplification. Moreover, replacing existing POTS loading coils with the loop extender 224 of FIG. 4 permits the loop extender 224 to potentially use any housing or other hardware (not shown) associated with the previously existing POTS loading coils, thereby potentially facilitating installation of the loop extender 224 of FIG. 4 along the local loop 214. Additional details of the components of the loop extender 224 of FIG. 4 are discussed below with reference to FIGS. 5–18.

Figure 5:
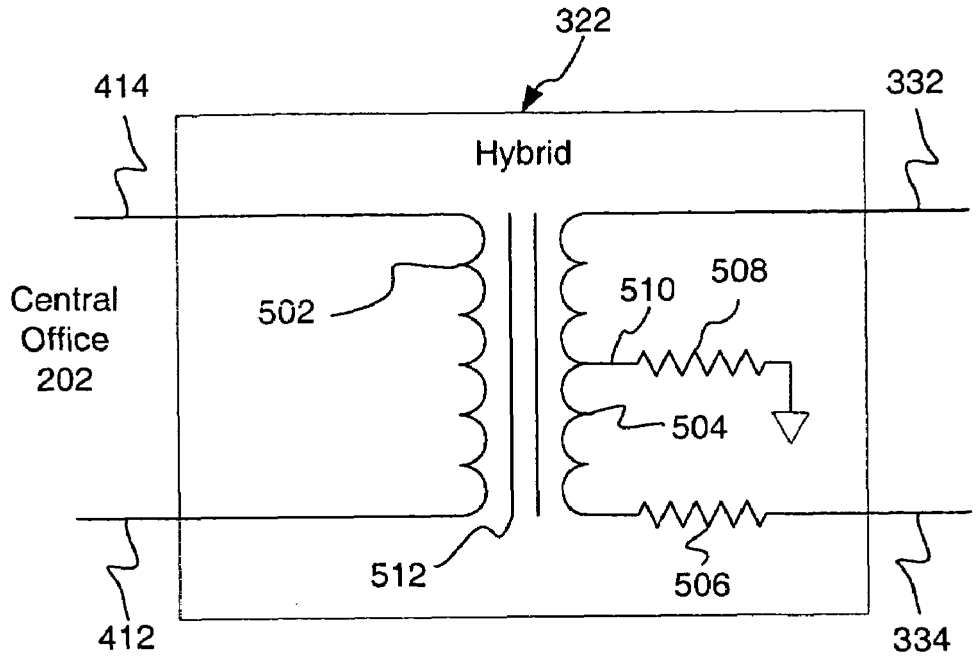
FIG. 5 illustrates one embodiment of a FIG. 4 hybrid.
Figure 6:
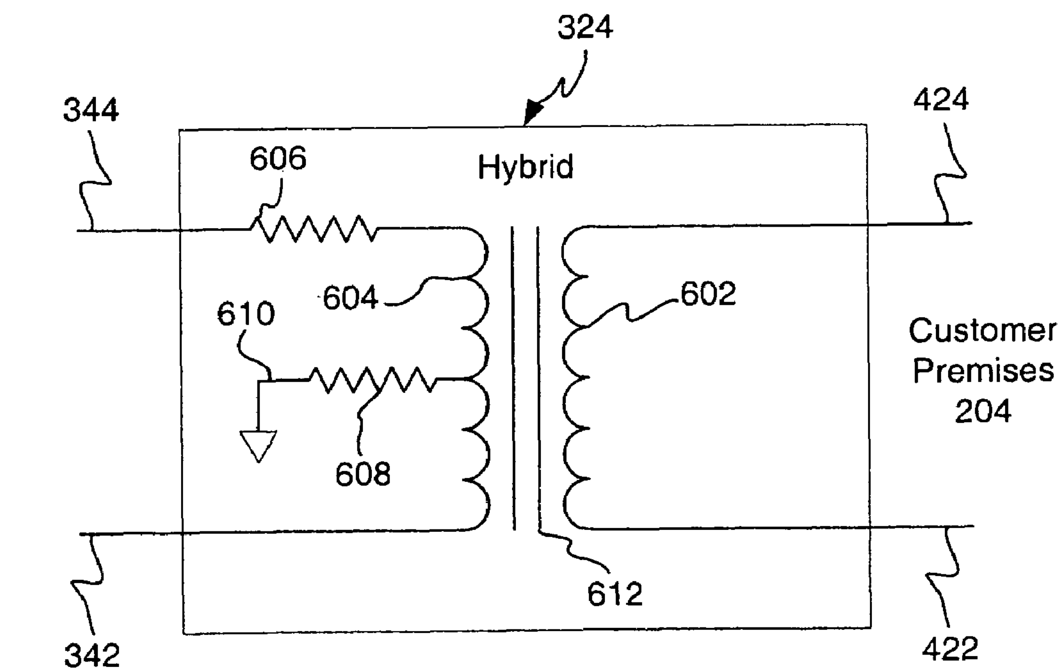
FIG. 6 illustrates one embodiment of another FIG. 4 hybrid.

FIGS. 5 and 6 illustrate one embodiment of the hybrids 322 and 324 respectively. As shown in FIG. 5, the hybrid 322 includes a winding 502 coupled to the central office side of the loop 214 (not shown) via lines 412 and 414 and a winding 504 coupled to lines 332 and 334. Line 332 couples the hybrid 322 to the downstream filter 302. Line 334 couples the hybrid 322 to the upstream amplifying element 314 via a resistor 506 (100 ohms). The winding 504 is also coupled to ground via a resistor 508 (50 ohms) along center tap line 510. The hybrid 322 also includes a conventional electromagnetic core 512.

As those skilled in the art will appreciate, it is generally desirable for the hybrid 322 to substantially match the impedance of the associated loop 214 to improve transmission of DSL signals between the hybrid 322 and the loop 214. Consequently, depending on the particular application and impedance characteristics of the associated local loop 214, it may be desirable, in some instances, to replace each of the resistors 506 and 508 with an impedance network having a complex impedance to potentially better match the impedance of the associated local loop 214. The design and implementation of such impedance networks is well within the level of ordinary skill in the art.

As shown in FIG. 6, the hybrid 324 includes a winding 602 coupled to the customer premises side of the loop 214 (not shown) via lines 422 and 424 and a winding 604 coupled to lines 342 and 344. Line 342 couples the hybrid 324 to the upstream filter 312. Line 344 couples the hybrid 324 to the downstream amplifying element 314 via a resistor 606 (100 ohms). The winding 604 is also coupled to ground via a resistor 608 along center tap line 510. The hybrid 322 also includes a conventional electromagnetic core 612.

It is also generally desirable for the hybrid 324 to substantially match the impedance of the associated loop 214 to improve transmission of DSL signals between the hybrid 324 and the loop 214. Consequently, depending on the particular application and impedance characteristics of the associated local loop 214, it may be desirable, in some instances, to replace each of the resistors 606 and 608 with an impedance network having a complex impedance to potentially better match the impedance of the associated local loop 214.

Figure 7:
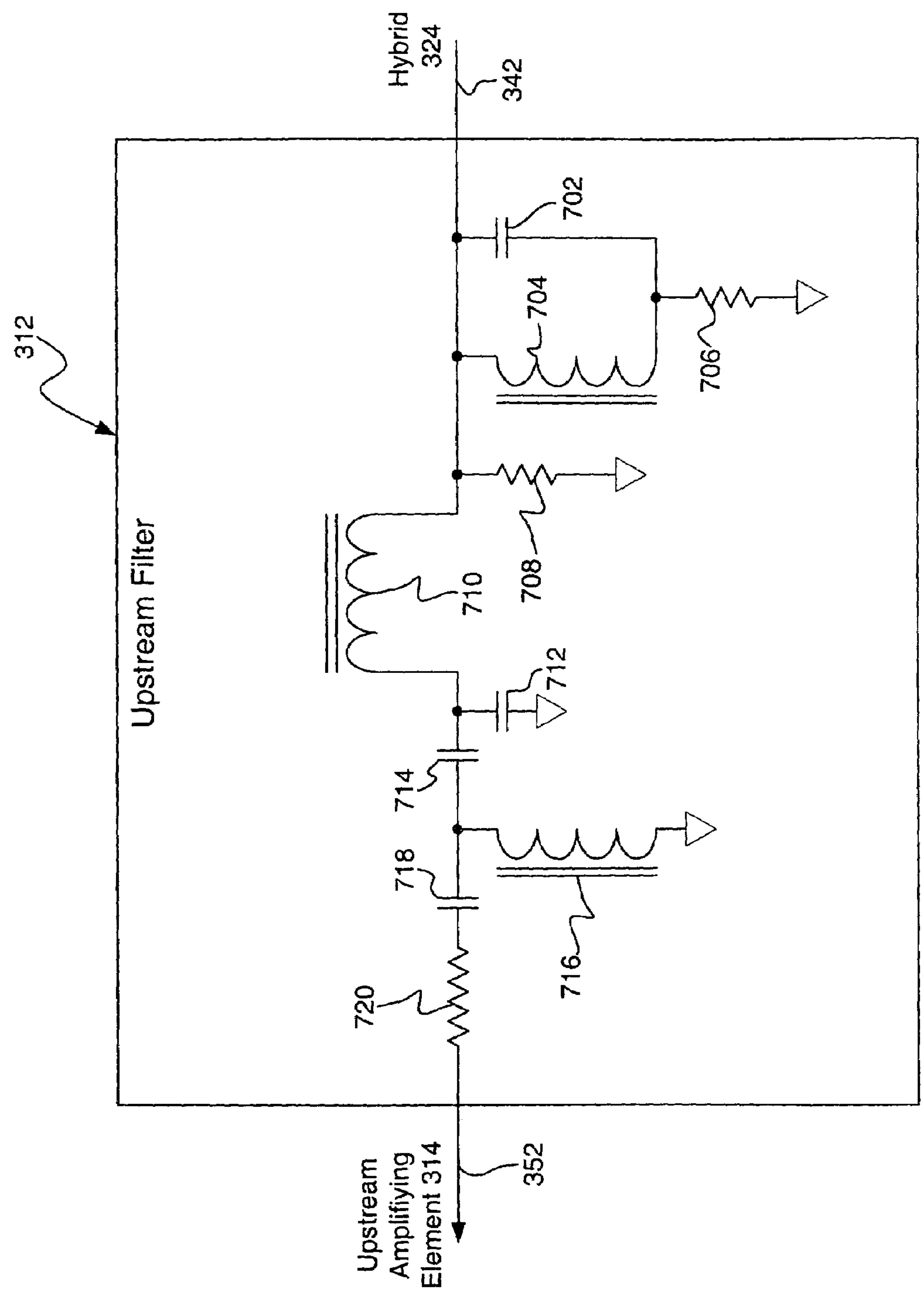
FIG. 7 illustrates one embodiment of a FIG. 4 upstream filter.

FIG. 7 illustrates one embodiment of the upstream filter 312 of FIG. 4. As shown, the upstream filter 312 is a circuit having a capacitor 702 (7.3 nF) in parallel with an inductor 704 (1.2 mH), which are coupled to ground via a resistor 706 (200 ohms). Adjacent to the inductor 704 is a resistor 708 (200 ohms) coupled to ground. An inductor 710 (360 uH) is disposed adjacent to the resistor 708. A capacitor 712 (4.6 nF) coupled to ground is disposed adjacent to the inductor 710 opposite the resistor 708. A capacitor 714 (16 nF) is disposed in series with the inductor 710 on the opposite side of the capacitor 712 as the inductor 710. An inductor 716 (1.5 mH) coupled to ground is disposed adjacent to the capacitor 714 opposite the capacitor 712. A capacitor 718

(45 nF) and a resistor 720 (300 ohms) are also provided in series with the capacitor 714 opposite the inductor 716.

In this configuration, the upstream filter 312 is operative to attenuate signals outside the upstream frequency band. Specifically, in this embodiment, the upstream filter 312 attenuates signals in the downstream band, such as the 150 kHz –1.104 MHz band for one embodiment of downstream Category I ADSL signals. Those skilled in the art will appreciate that many different component configurations and component values may be employed to achieve a comparable filtering function and, therefore, the details described above in connection with FIG. 7 are to be considered in an illustrative and not restrictive sense.

Figure 8:
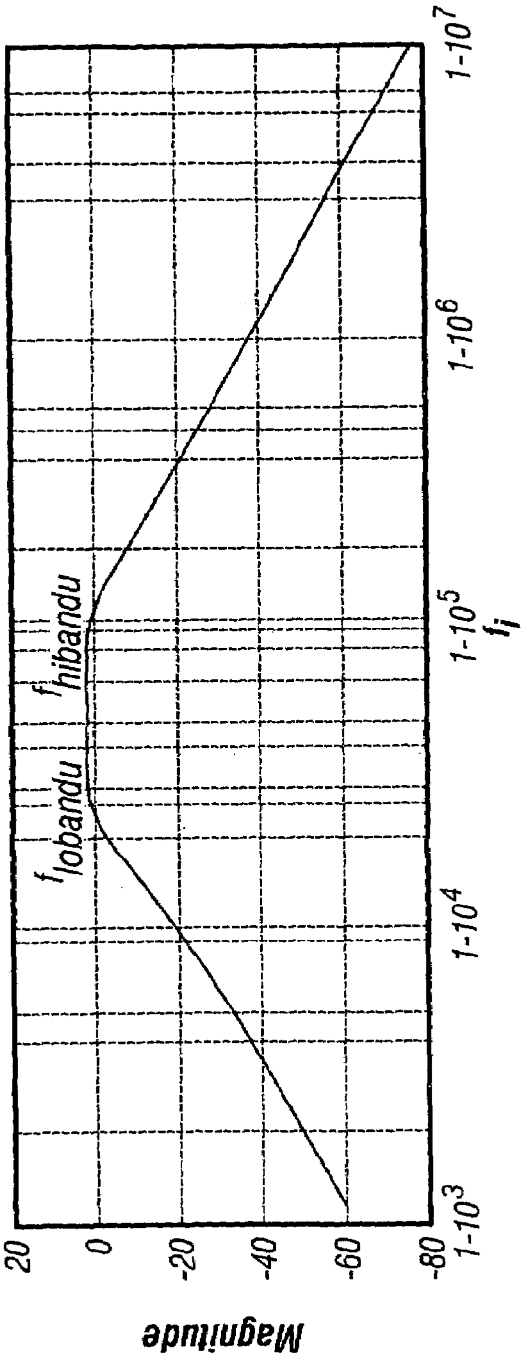
FIG. 8 illustrates the magnitude of the frequency response of the FIG. 7 filter.
Figure 9:
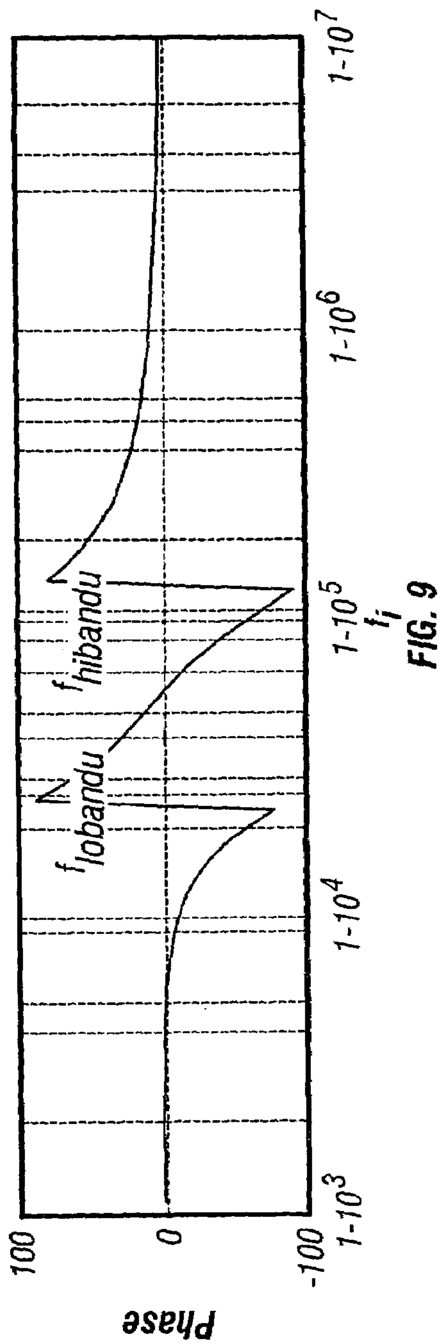
FIG. 9 illustrates the phase of the frequency response of the FIG. 7 filter.

FIG. 8 illustrates the magnitude of the frequency response of the upstream filter 312 of FIG. 7. As illustrated, the upstream filter 312 attenuates signals above and below the upstream frequency band of about 25–120 kHz. FIG. 9 illustrates the phase of the frequency response of the upstream filter 312 of FIG. 7 and shows the locations of the poles.

Figure 10:
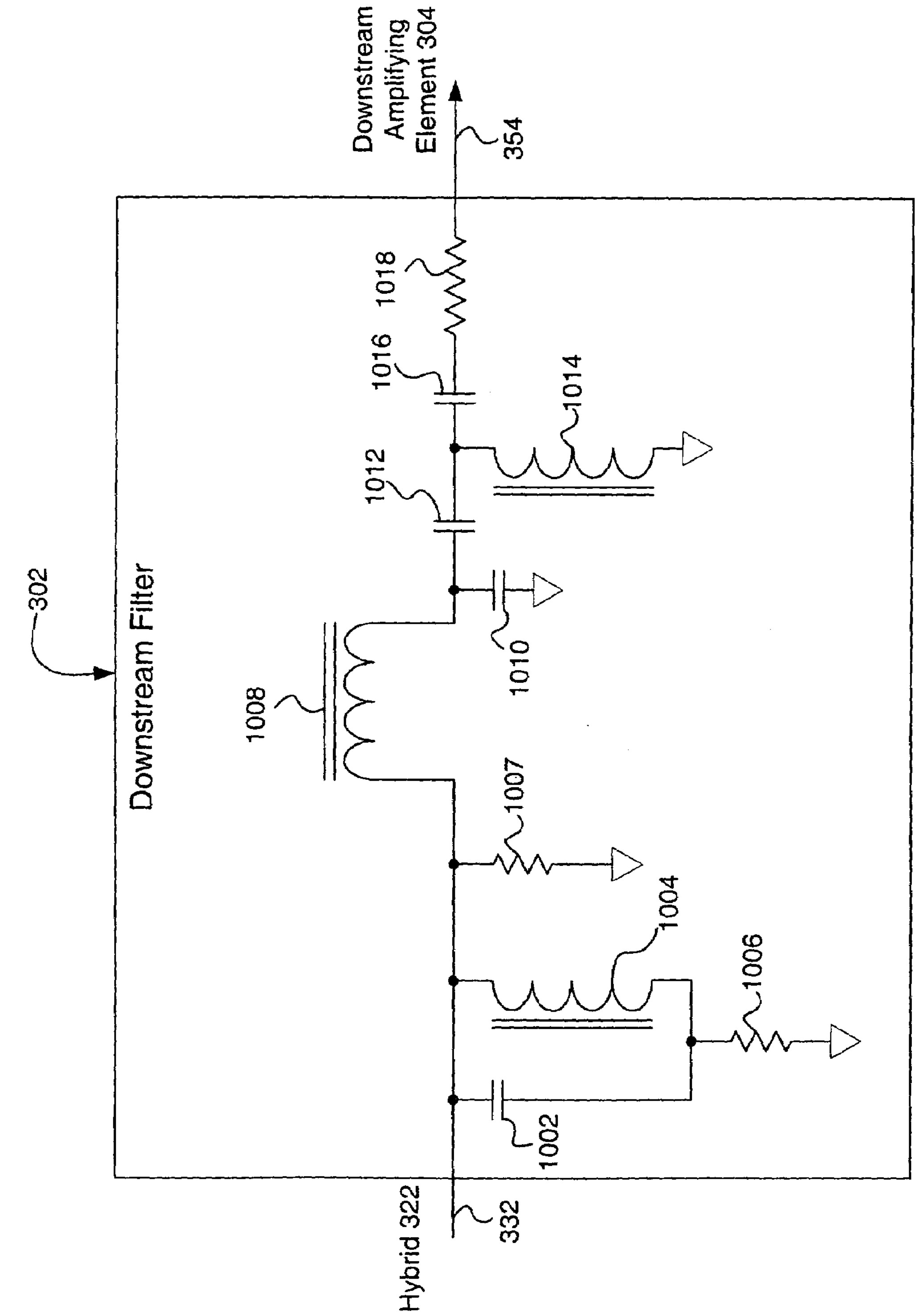
FIG. 10 illustrates one embodiment of a FIG. 4 downstream filter.

FIG. 10 illustrates one embodiment of the downstream filter 302 of FIG. 4. The downstream filter 302 is disposed between the hybrid 322 and the downstream amplifying element 304 for attenuating signals outside the downstream frequency band, such as upstream band DSL signals that have been leaked through the hybrid 322. Adjacent to the hybrid 322, the downstream filter includes a capacitor 1002 (780 pf) and an inductor 1004 (180 uH) disposed in parallel and coupled to ground via a resistor 1006 (200 ohms). A resistor 1007 (200 ohms) is also coupled to ground adjacent the inductor 1004. An inductor 1008 (42 uH) is disposed adjacent to the resistor 1007. A capacitor 1010 (410 pF) coupled to ground is disposed adjacent to the inductor 1008 opposite the resistor 1007. Another capacitor 1012 (2.7 nF) is disposed in series with the inductor 1008 and adjacent to the capacitor 1010 opposite the inductor 1008. An inductor 1014 (270 uH) coupled to ground is disposed adjacent to the capacitor 1012 opposite the capacitor 1010. Another capacitor 1016 (10 nF) is disposed in series with the capacitor 1012 adjacent the inductor 1014 opposite the capacitor 1012. A resistor 1018 (300 ohms) is disposed in series with the capacitor 1016 between the capacitor 1016 and the line 354 leading to the downstream amplifying element 304.

In this configuration, the downstream filter 302 is operative to attenuate signals outside the downstream frequency band. Specifically, in this embodiment, the downstream filter 302 attenuates signals in the upstream band, such as the 25–120 kHz band for downstream ADSL. Those skilled in the art will appreciate that many different component configurations and component values may be employed to achieve a comparable filtering function and, therefore, the details described above in connection with FIG. 10 are to be considered in an illustrative and not restrictive sense.

Figure 11:
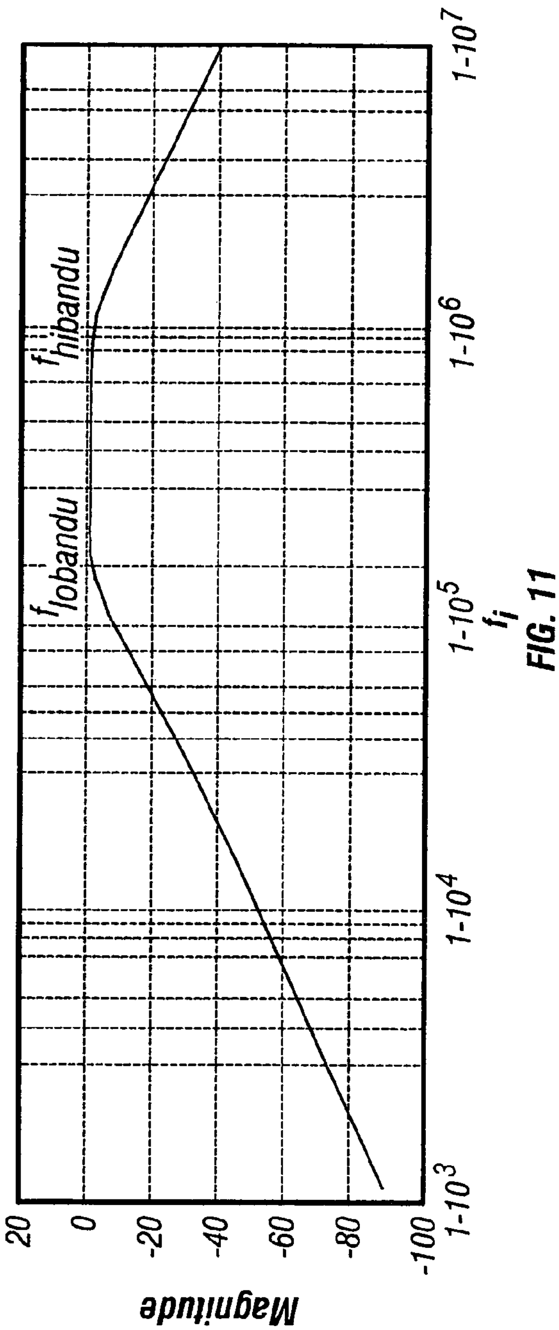
FIG. 11 illustrates the magnitude of the frequency response of the FIG. 10 filter.
Figure 12:
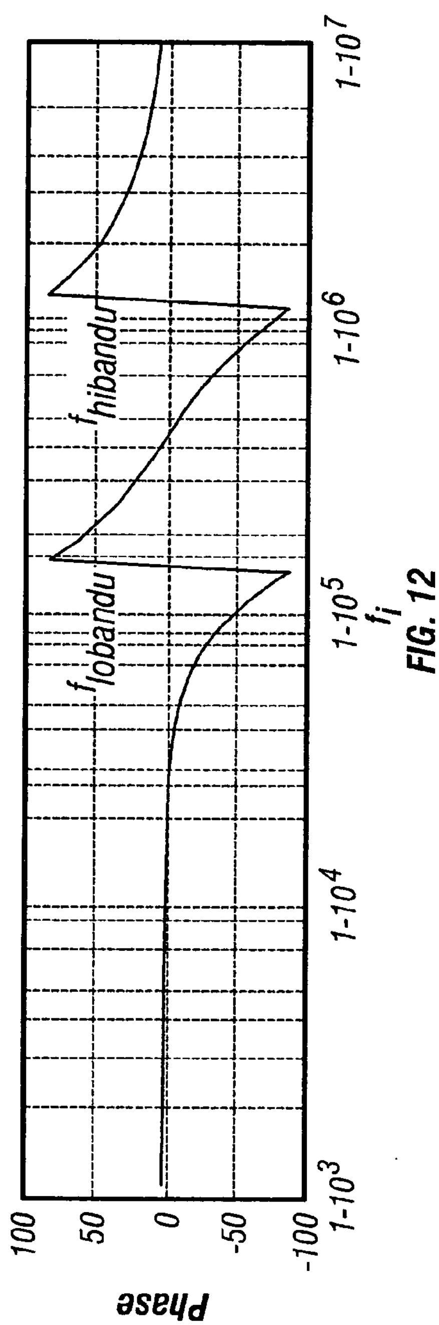
FIG. 12 illustrates the phase of the frequency response of the FIG. 10 filter.

FIGS. 11 and 12 respectively illustrate the magnitude and phase of the frequency response of the downstream filter 302 of FIG. 10. As shown in FIG. 11, the downstream filter 302 passes signals in the downstream band range. As discussed above, the downstream band range for one version of Category I ADSL is about 150 kHz to about 1.104 MHz. Therefore, for this version of ADSL, the downstream filter 302 attenuates signals above and below this band. FIG. 12 illustrates the phase of the frequency response of the downstream filter 302 of FIG. 10 and shows the position of the filter poles.

Figure 13:
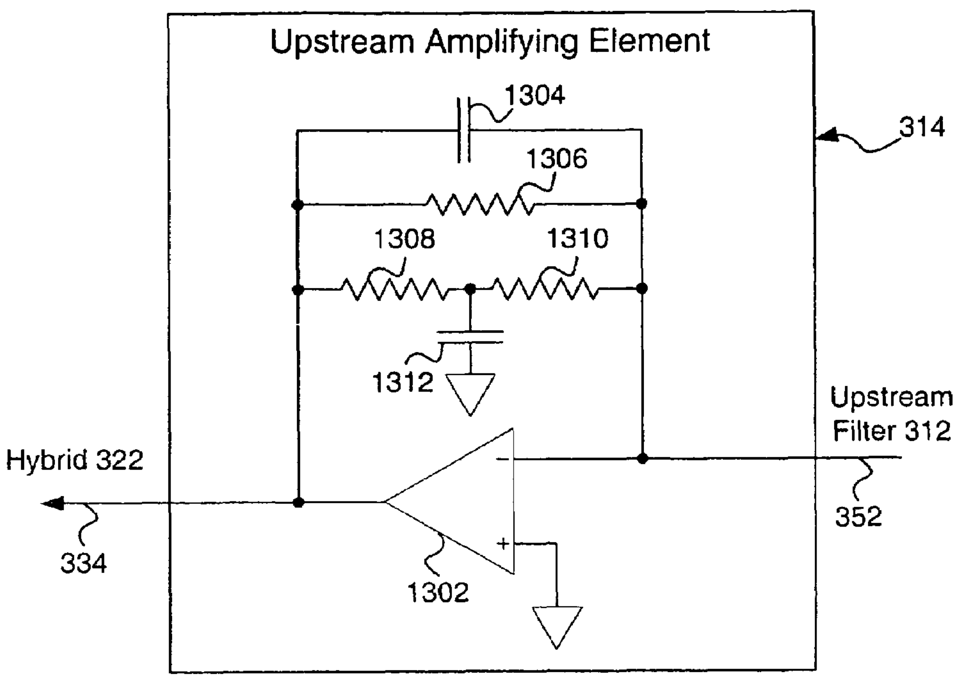
FIG. 13 illustrates one embodiment of a FIG. 4 upstream amplifying element.

FIG. 13 illustrates one embodiment of the upstream amplifying element 314 of FIG. 4. As shown, the upstream amplifying element 314 is disposed between the upstream filter 312 and the hybrid 322 for amplifying upstream DSL signals and passing the amplified upstream DSL signals to the hybrid 322 to be passed to the local loop 214. In this embodiment, the upstream amplifying element 314 is an amplifying equalizer having an operational amplifier 1302, a capacitor 1304 (620 pF), a resistor 1306 (10 K ohms), resistors 1308 (1700 ohms) and 1310 (290 ohms), and a capacitor 1312 (4.1 nF). As shown, the operational amplifier 1302 has a positive input coupled to ground and a negative input coupled to line 352, which couples the upstream amplifying element 314 to the upstream filter 312. The output of the operational amplifier 1302 is coupled to line 334, which couples the upstream amplifying element 314 to the hybrid 322. The resistors 1308 and 1310 are disposed in series with each other and in parallel with the resistor 1306 and the capacitor 1304. Moreover, the resistors 1308 and 1310 are also coupled to ground via the capacitor 1312, which is disposed between the resistors 1308 and 1310. Additional characteristics of the upstream amplifying element 314 are described below with reference to FIGS. 15 and 16.

In this configuration, the upstream amplifying element 314 is operative to amplifying upstream DSL signals and to provide more amplification to upstream DSL signals according to their frequency by amplifying higher frequency upstream DSL signals more than lower frequency upstream DSL signals. Those skilled in the art will appreciate that many different component configurations and component values may be employed to achieve a comparable or satisfactory amplifying function and, therefore, the details described above in connection with FIG. 13 are to be considered in an illustrative and not restrictive sense.

Figure 14:
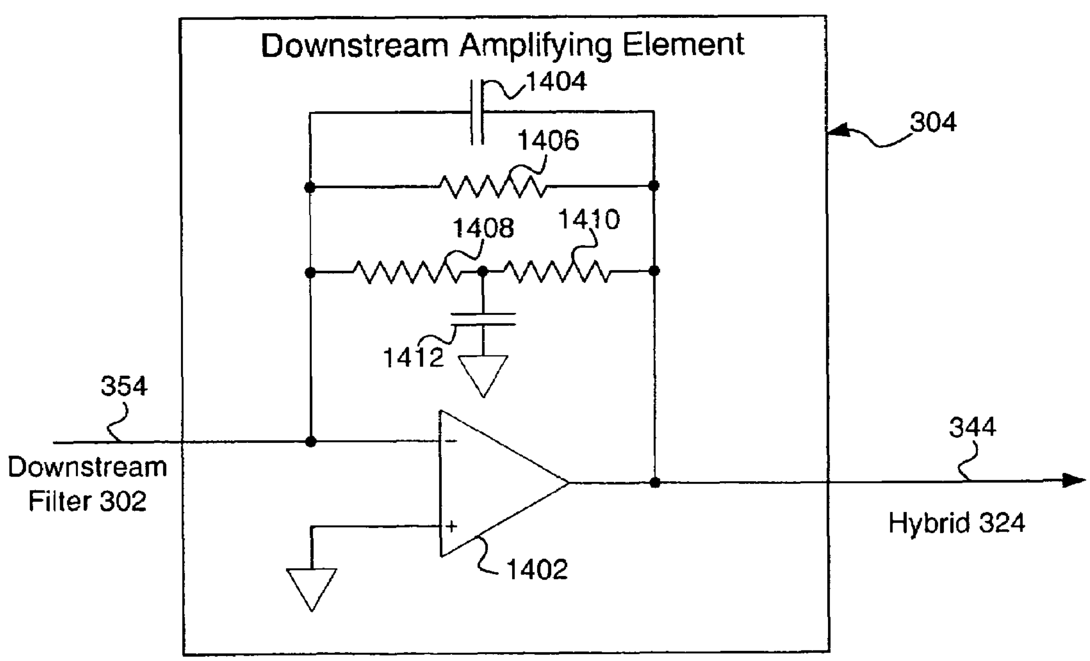
FIG. 14 illustrates one embodiment of a FIG. 4 downstream amplifying element.

FIG. 14 illustrates one embodiment of the downstream amplifying element 304 of FIG. 4. In this embodiment, the downstream amplifying element 304 is an amplifying equalizer having an operational amplifier 1402, a capacitor 1404 (11 pF), a resistor 1406 (44 K ohms), resistors 1408 (260 ohms) and 1410 (1600 ohms), and capacitor 1412 (4.1 nF). As shown, the operational amplifier 1402 has a positive input coupled to ground and a negative input coupled to line 354, which couples the downstream amplifying element 304 to the downstream filter 302. The output of the operational amplifier 1402 is coupled to line 344, which couples the downstream amplifying element 304 to the hybrid 324. The resistors 1408 and 1410 are disposed in series with each other and in parallel with the resistor 1406 and the capacitor 1404. Moreover, the resistors 1408 and 1410 are also coupled to ground via the capacitor 1412, which is disposed between the resistors 1408 and 1410. Additional characteristics of the downstream amplifying element 304 are described below with reference to FIGS. 17 and 18.

In this configuration, the downstream amplifying element 304 is operative to amplifying downstream DSL signals and to provide more amplification to downstream DSL signals according to their frequency by amplifying higher frequency downstream DSL signals more than lower frequency downstream DSL signals. Those skilled in the art will appreciate that many different component configurations and component values may be employed to achieve a comparable or satisfactory amplifying function and, therefore, the details described above in connection with FIG. 14 are to be considered in an illustrative and not restrictive sense.

Figure 15:
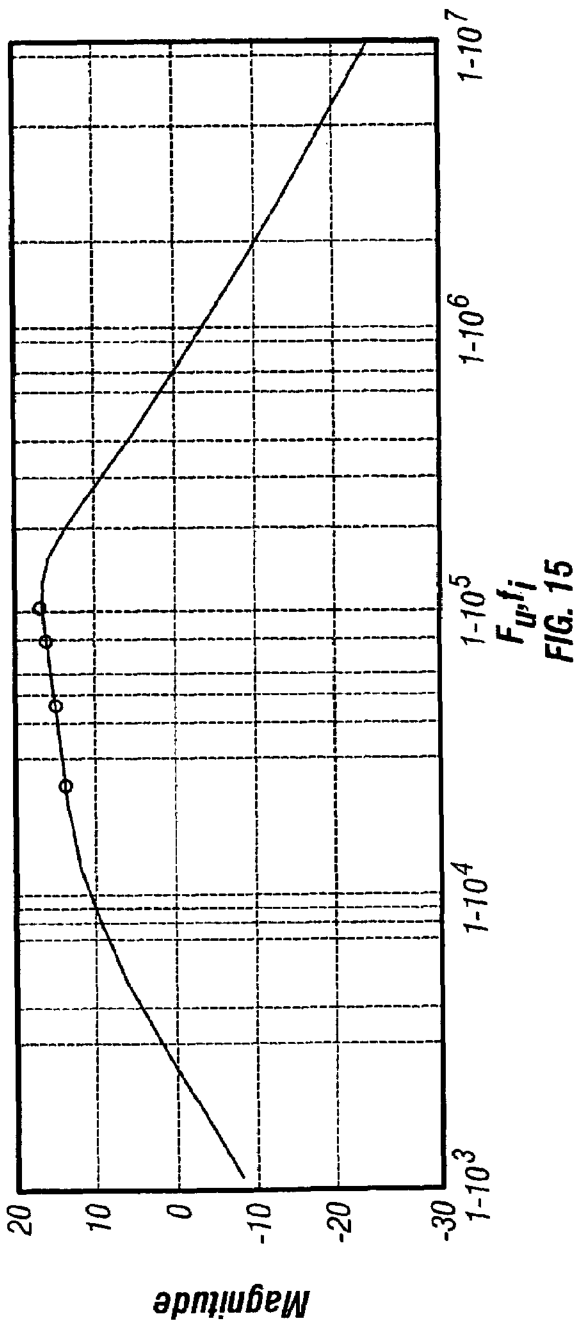
FIG. 15 illustrates the magnitude of the frequency response of the upstream amplifying element of FIG. 13.
Figure 16:
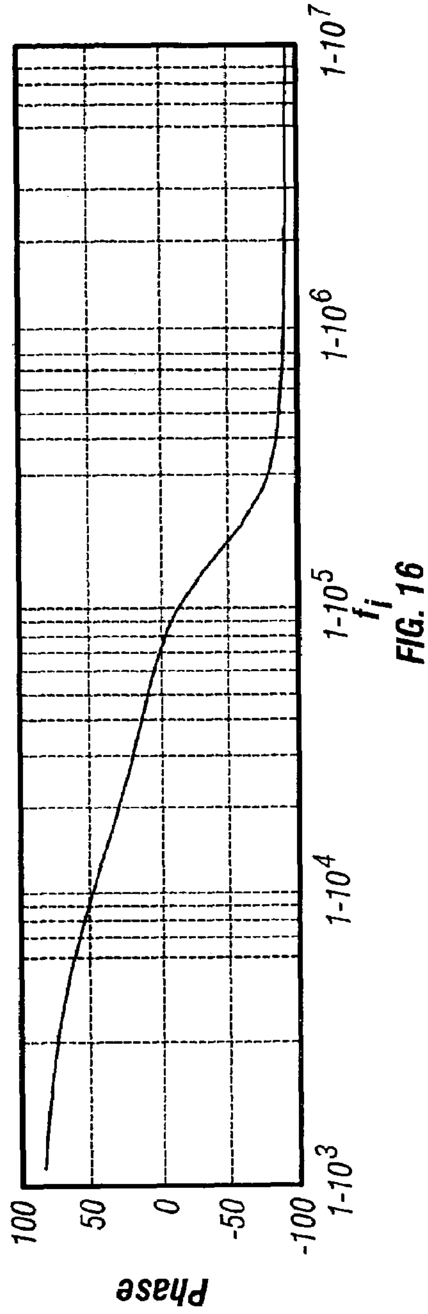
FIG. 16 illustrates the phase of the frequency response of the upstream amplifying element of FIG. 13.

FIGS. 15 and 16 respectively illustrate the magnitude and phase of the frequency response of the upstream amplifying element 314 of FIG. 13. In particular, FIG. 15 shows signal magnitude amplification as a function of signal frequency. As shown, the upstream amplifying element 314 of FIG. 13 amplifies higher upstream frequency signals more than lower upstream frequency signals to at least partially compensate for the tendency of higher frequency signals to be more attenuated as they traverse a local loop than lower frequency signals. Thus, for example, the upstream amplifying element 314 shown in FIG. 13 will amplify a 100 kHz signal more than a 25 kHz signal.

Figure 17:
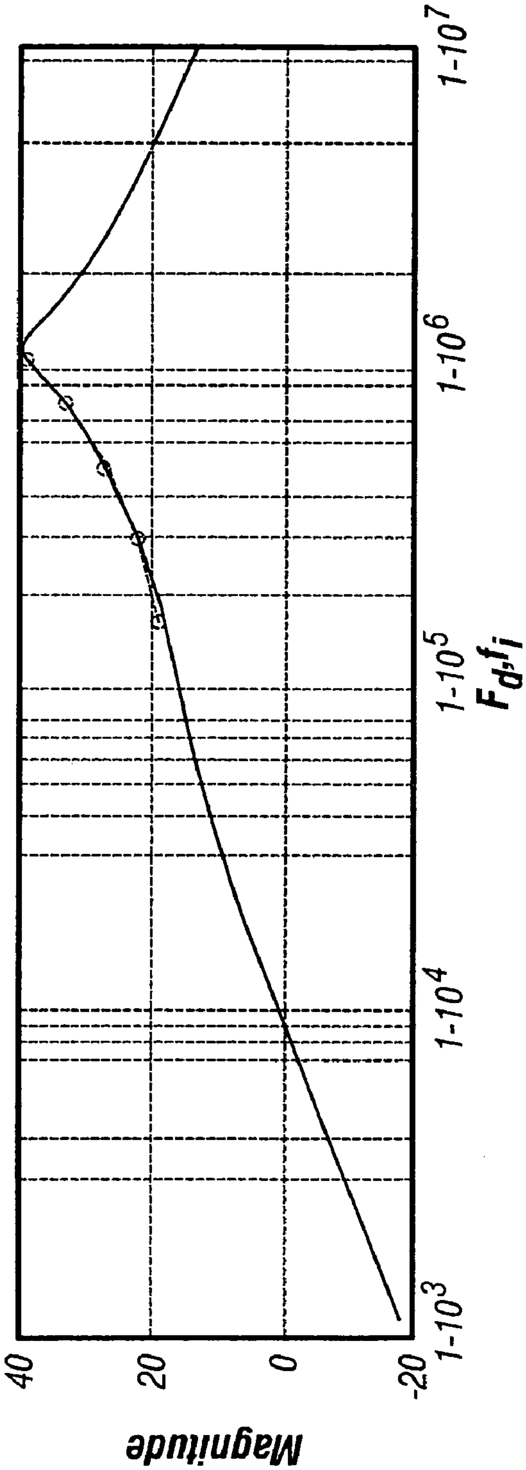
FIG. 17 illustrates the magnitude of the frequency response of the FIG. 14 downstream amplifying element.
Figure 18:
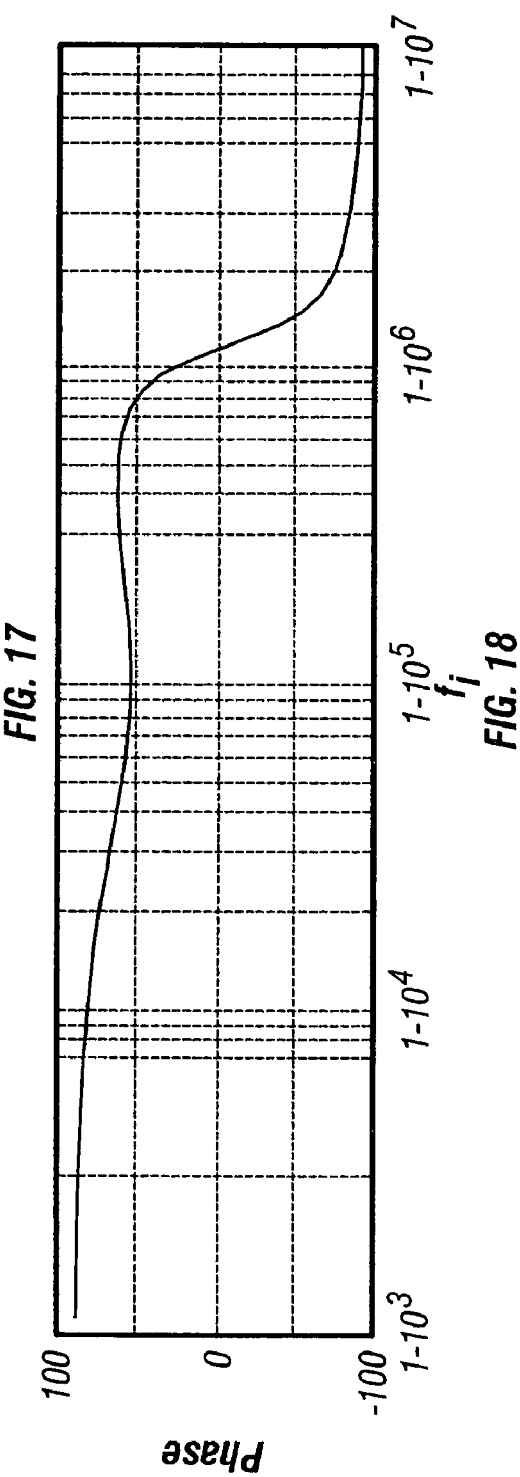
FIG. 18 illustrates the phase of the frequency response of the downstream amplifying element of FIG. 14.

FIGS. 17 and 18 respectively illustrate the magnitude and phase of the frequency response of the downstream amplifying element 304 of FIG. 14. In particular, FIG. 17 shows signal magnitude amplification as a function of signal frequency. As shown, the downstream amplifying element 304 of FIG. 14 amplifies higher downstream frequency signals more than lower downstream frequency signals to at least partially compensate for the tendency of higher frequency signals to be more attenuated as they traverse a local loop than lower frequency signals. Thus, for example, the downstream amplifying element 304 shown in FIG. 14 will amplify a 1 MHz signal more than a 150 kHz signal.

Figure 19:
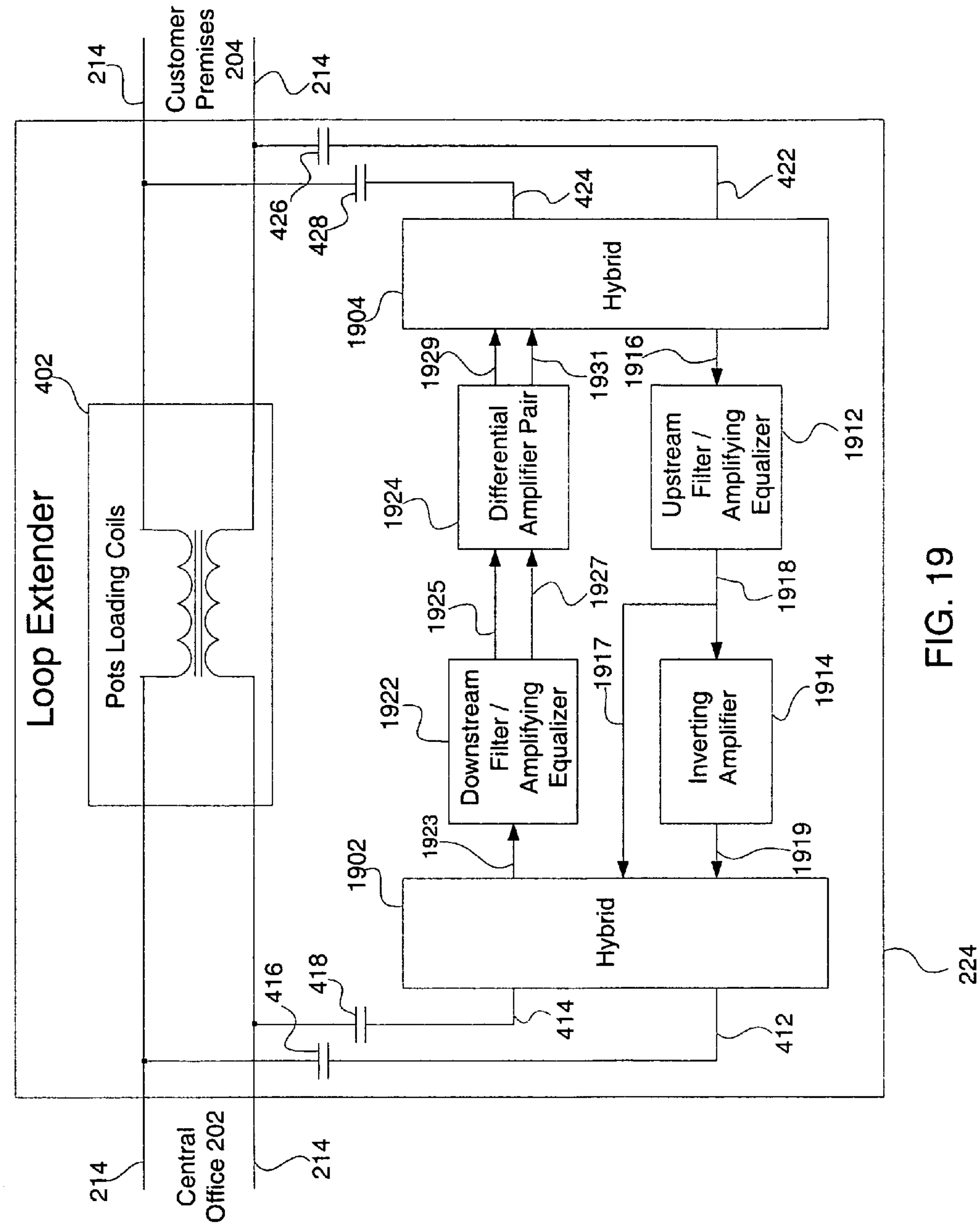
FIG. 19 illustrates another embodiment of a FIG. 2 loop extender, according to the invention.

FIG. 19 illustrates another embodiment of the loop extender 224 of FIG. 2. As shown, the loop extender 224 is disposed between the central office 202 and a customer premises 204 and is coupled to the local loop 214. The loop extender 224 of FIG. 19 may include the POTS loading coils 402, the details and purposes of which are described above in conjunction with FIG. 4.

The FIG. 19 loop extender 224 also includes a central office side hybrid 1902 and a customer premises side hybrid 1904. Further, the FIG. 19 loop extender 224 includes an upstream band separation filter/amplifying equalizer 1912, an upstream inverting amplifier 1914, a downstream band separation filter/amplifying equalizer 1922, and a downstream differential amplifier pair 1924.

In general, upstream DSL signals, such as upstream ADSL or VDSL signals, are received from the customer premises 204 along the loop 214 by the hybrid 1904 and passed onto the upstream filter/amplifying equalizer 1912 via line 1916. The upstream filter/amplifying equalizer 1912 filters out signals in the downstream band that may have leaked through the hybrid 1904 and amplifies the upstream DSL signals. After amplifying the upstream signals and attenuating signals in the downstream frequency band, the upstream filter amplifying equalizer 1912 passes the upstream DSL signals to the inverting amplifier 1914 via line 1918. The upstream filter amplifying equalizer 1912 also passes the filtered and amplified upstream DSL signals to the hybrid 1902 via the line 1917. The inverting amplifier 1914 then inverts the received signal and passes the inverted signal to the hybrid 1902 via line 1919. Hence, as described in more detail below, the hybrid 1902 is differentially driven by both the upstream filter/amplifying equalizer 1912 and the inverting amplifier 1914.

The loop extender 224 receives downstream DSL signals from the central office 202 along the local loop 214 by the hybrid 1902. The hybrid 1902 then passes the received downstream DSL signals to the downstream filter/amplifying equalizer 1922 along line 1923. The downstream filter/amplifying equalizer 1922 attenuates signals outside the downstream DSL frequency band, such as signals in the upstream frequency band that may have leaked through the hybrid 1902. The downstream filter/amplifying equalizer 1922 also amplifies the downstream DSL signals and passes the amplified and attenuated downstream DSL signals to the differential amplifier pair 1924 for further amplification via lines 1925 and 1927. The differential amplifier pair 1924 amplifies the downstream DSL signals and passes the amplified downstream DSL signals onto the loop 214 by differentially driving the hybrid 1904 via lines 1929 and 1931.

Figure 20:
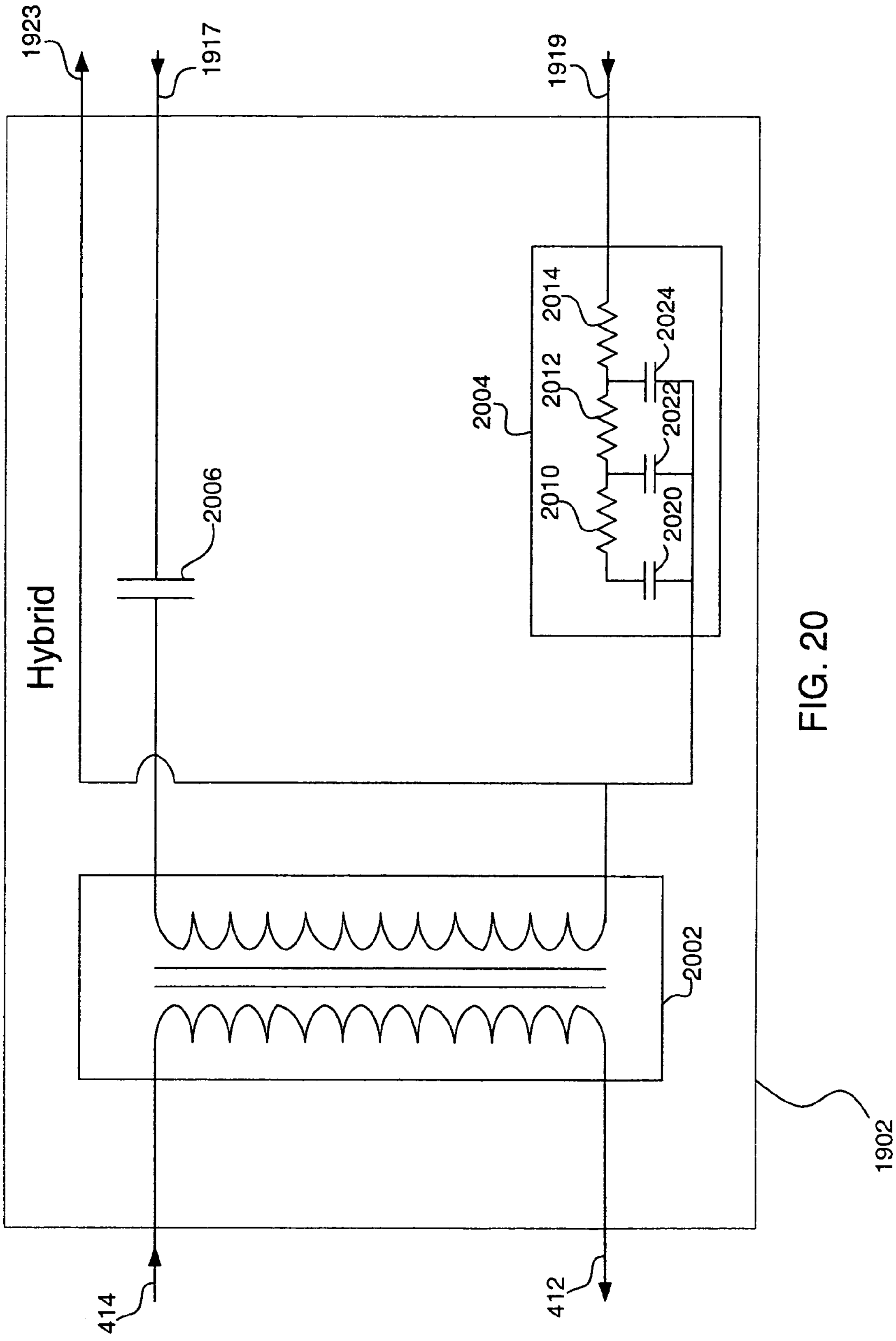
FIG. 20 illustrates one embodiment of the hybrid on the central office side of the FIG. 19 loop extender, according to the invention.

FIG. 20 illustrates one embodiment of the hybrid 1902 of FIG. 19. As shown, the hybrid 1902 is coupled to the loop 214 via the lines 412 and 414 and is also coupled to the downstream filter/amplifying equalizer 1922 via line 1923, to the upstream filter/amplifying equalizer 1912 via line 1917, and to the inverting amplifier 1914 by line 1919. The hybrid 1902 includes a transformer 2002, an impedance network 2004, and a capacitor 2006. The transformer 2002 has a turns ratio of 1:0.707. The impedance network 2004 is coupled to line 1919 and has a net impedance that advantageously approximates that of the loop 214 (FIG. 2) for the frequencies of interest. The capacitor 2006 capacitively separates the transformer 2002 and the upstream filter/amplifying equalizer 1912.

In this configuration, the inverting amplifier 1914 and the upstream filter/amplifying equalizer 1912 differentially drive the hybrid 1902 via lines 1919 and 1917. Since the inverting amplifier 1914 inverts signals, signals on line 1917 are 180 degrees out of phase with signals on line 1919. Therefore, the hybrid 1902 is differentially driven with an effective peak-to-peak voltage level that is twice the voltage level applied by either line 1917 or line 1919 individually. Differentially driving the hybrid 1902 provides an additional 6 dB of amplification for the upstream DSL signals, which are passed to the local loop 214 via line 412. The hybrid 1902 passes the downstream DSL signals to downstream filter/amplifying equalizer 1922 via line 1923. The impedance network 2004 is shown as including resistors 2010 (110 ohms), 2012 (80 ohms), and 2014 (50 ohms). The impedance network also shows capacitors 2020 (100 nF), 2022 (68 nF), and 2024 (56 nF).

Figure 21:
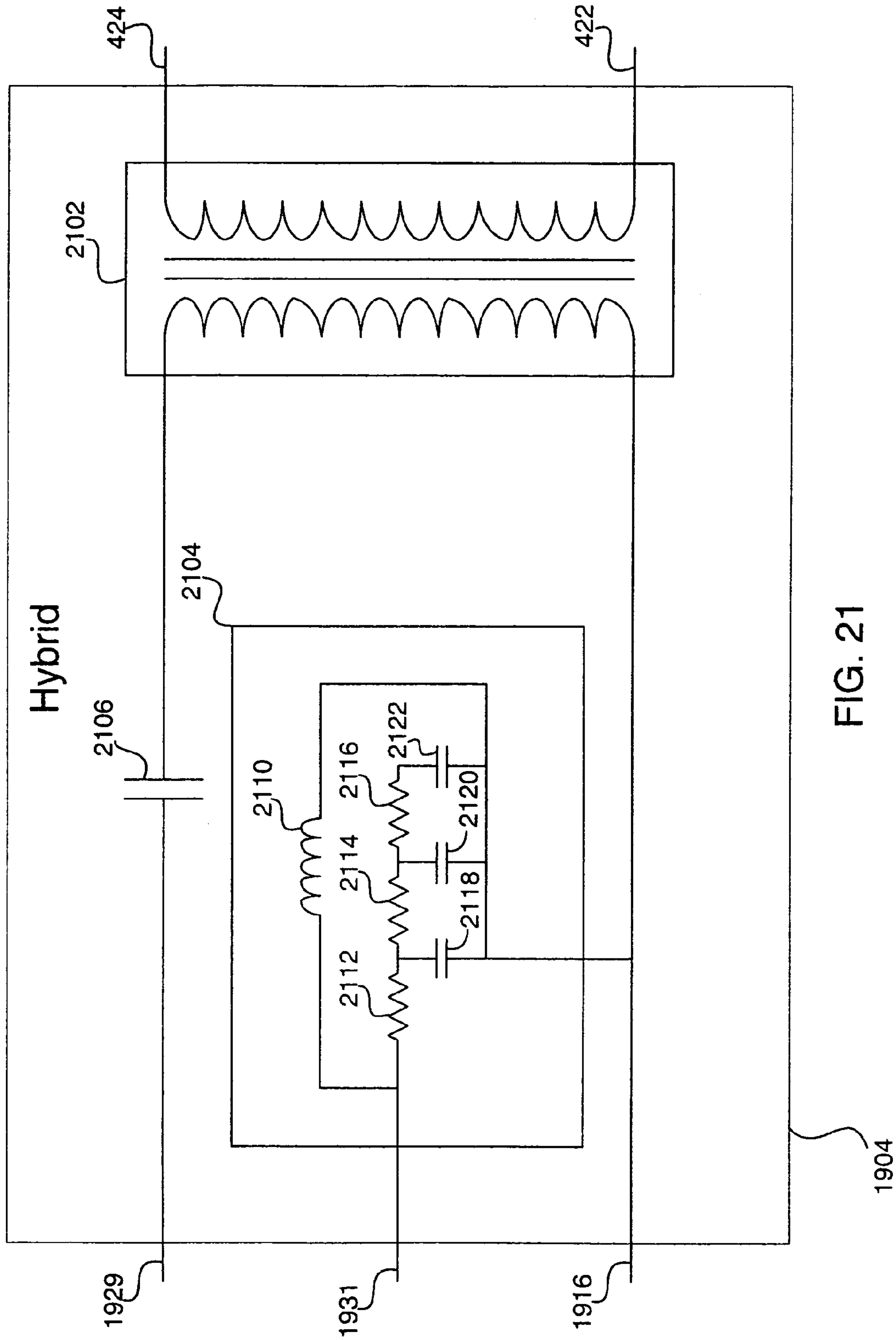
FIG. 21 illustrates one embodiment of the hybrid on the consumer premises side of the FIG. 19 loop extender, according to the invention.

FIG. 21 illustrates one embodiment of hybrid 1904 of FIG. 19. As shown, the hybrid 1904 includes a transformer 2102, an impedance network 2104, and a capacitor 2106 (470 nF). The differential amplifier pair 1924 (FIG. 19) differentially drive downstream DSL signals on the transformer 2102 via the lines 1929 and 1931. The hybrid passes the upstream signals received from the loop 214 to the upstream filter! amplifying equalizer 1912 via the line 1916. The impedance network 2104 is advantageously configured to approximate the impedance of the loop 214 for the frequencies of interest. In particular, the impedance network 2104 is shown as including an inductor 2110 (470 AH), resistors 2112 (50 ohms), 2114 (80 ohms), 2116 (110 ohms), and capacitors 2118 (56 nF), 2120 (68 nF), 2122 (100 nF).

Figure 22:
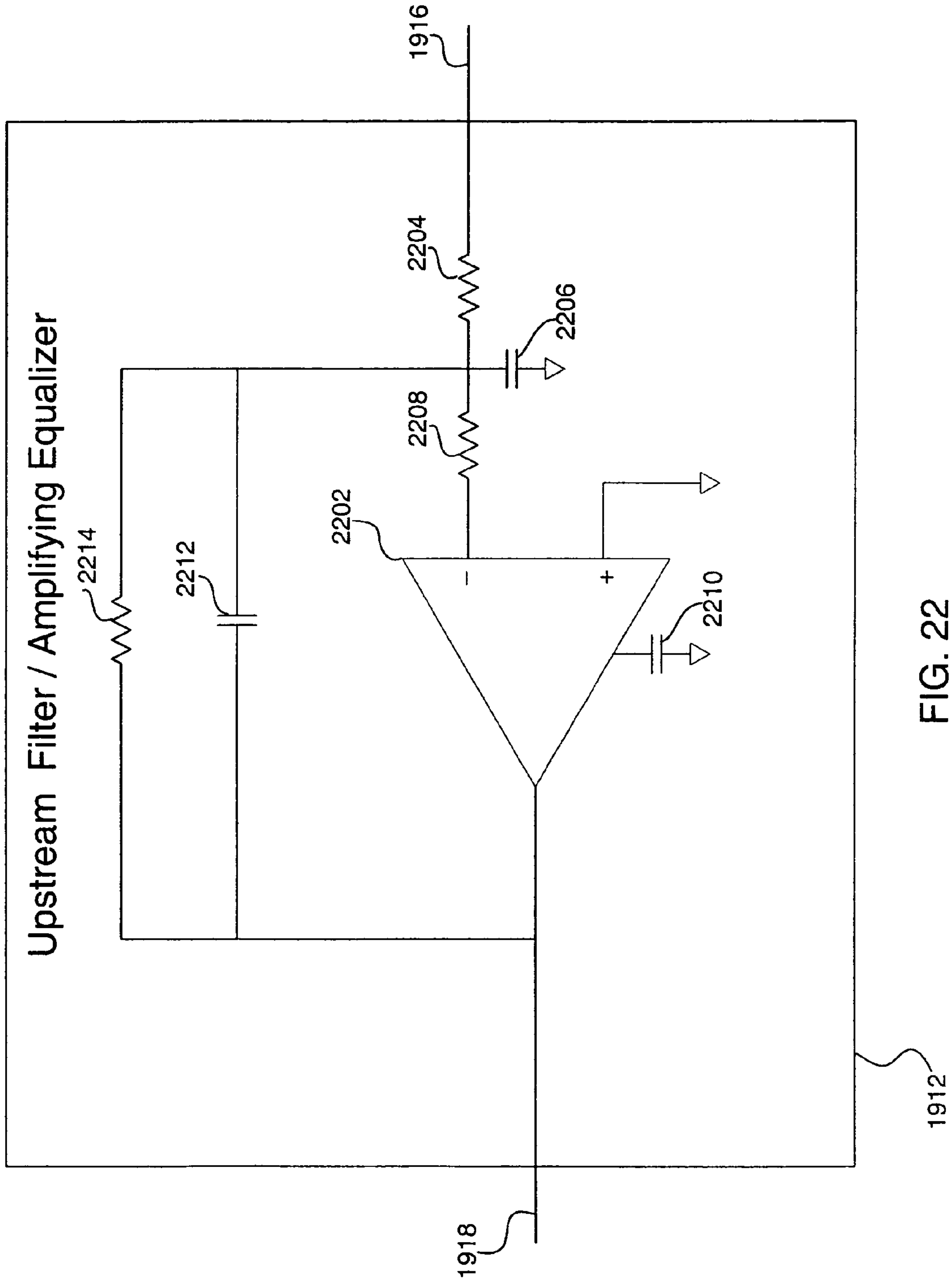
FIG. 22 illustrates one embodiment of the upstream filter/amplifying equalizer of the FIG. 19 loop extender, according to the invention.

FIG. 22 illustrates one embodiment of the upstream filter amplifying equalizer 1912 of FIG. 19. As shown, the upstream filter/amplifying equalizer 1912 includes an operational amplifier 2202, a resistor 2204 (1000 ohms), a capacitor 2206 (8.2 nF) coupled to the resistor 2204 and to ground, and a resistor 2208 (350 ohms) coupled to the negative input of the operational amplifier 2202. A resistor 2214 (2000 ohms) and a capacitor 2212 (390 pF) are disposed in parallel between the capacitor 2206 and the operational amplifier output along line 1918. A compensation capacitor 2210 (27 pF) stabilizes the operation amplifier 2202 for the desired gain and frequency response. The upstream filter/amplifying equalizer 1912 provides about 6 dB of amplification to signals in the upstream DSL signal frequency band and attenuates signals in the downstream DSL signal frequency band.

Figure 23:
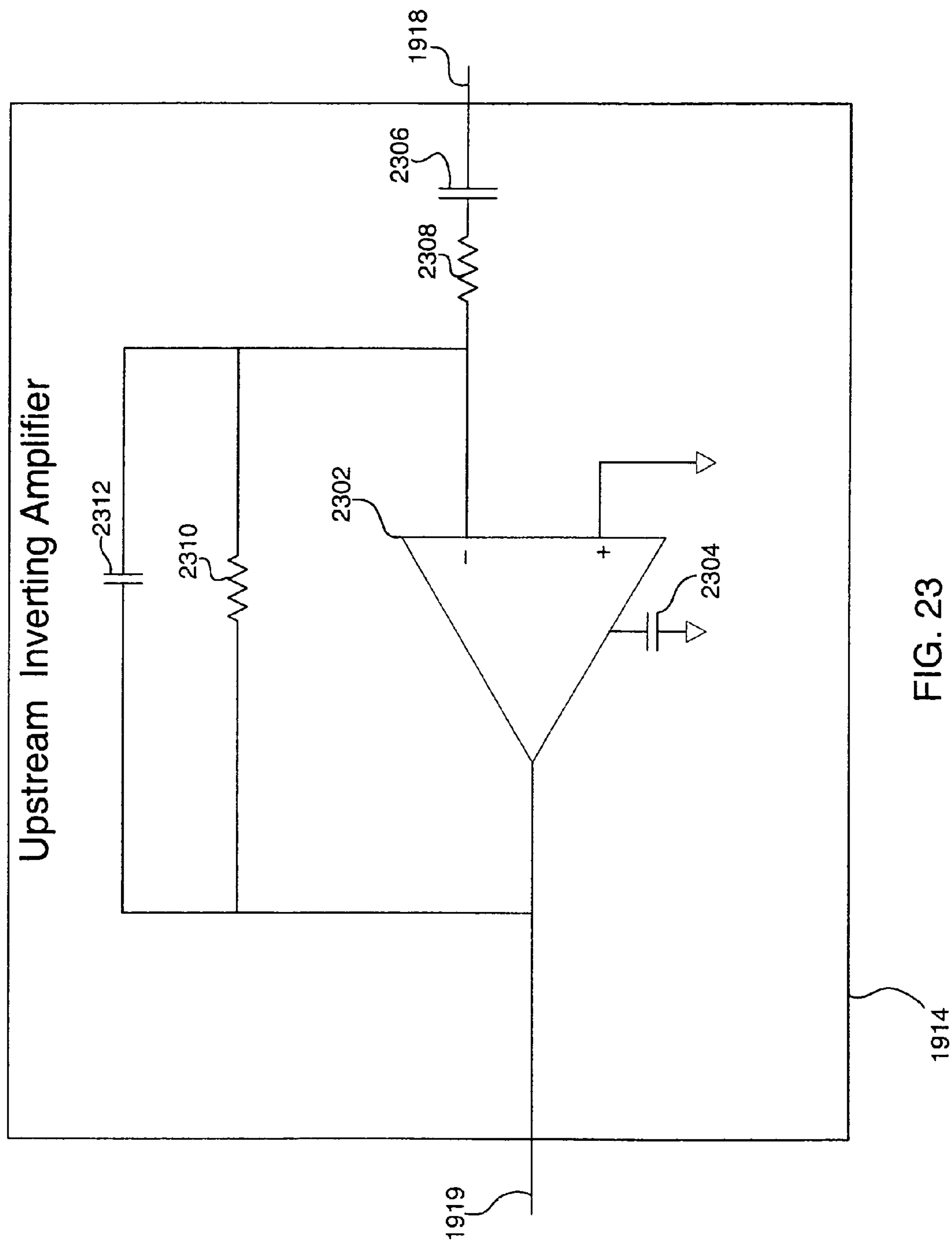
FIG. 23 illustrates one embodiment of the upstream inverting amplifier of the FIG. 19 loop extender, according to the invention.

FIG. 23 illustrates one embodiment of the inverting amplifier 1914 of FIG. 19. The inverting amplifier 1914 has unity gain and is provided to assist in differentially driving the hybrid 1902 by producing a signal on line 1919 that is 180 degrees out of phase with a signal on line 1917. As shown, the inverting amplifier 1914 includes an operational amplifier 2302, a compensation capacitor 2304 (27 pF), a capacitor 2306 (10 pF), a resistor 2308 (1000 ohms), a resistor 2310 (1000 ohms), and a capacitor 2312 (10 pF). The compensation capacitor 2304 (27 pF) stabilizes the operation amplifier 2302 for the desired gain and frequency response. The capacitor 2312 and the resistor 2310 are disposed in parallel with each other between the negative input of the operational amplifier 2302 and the output of the operational amplifier 2302 along line 1919.

Figure 24:
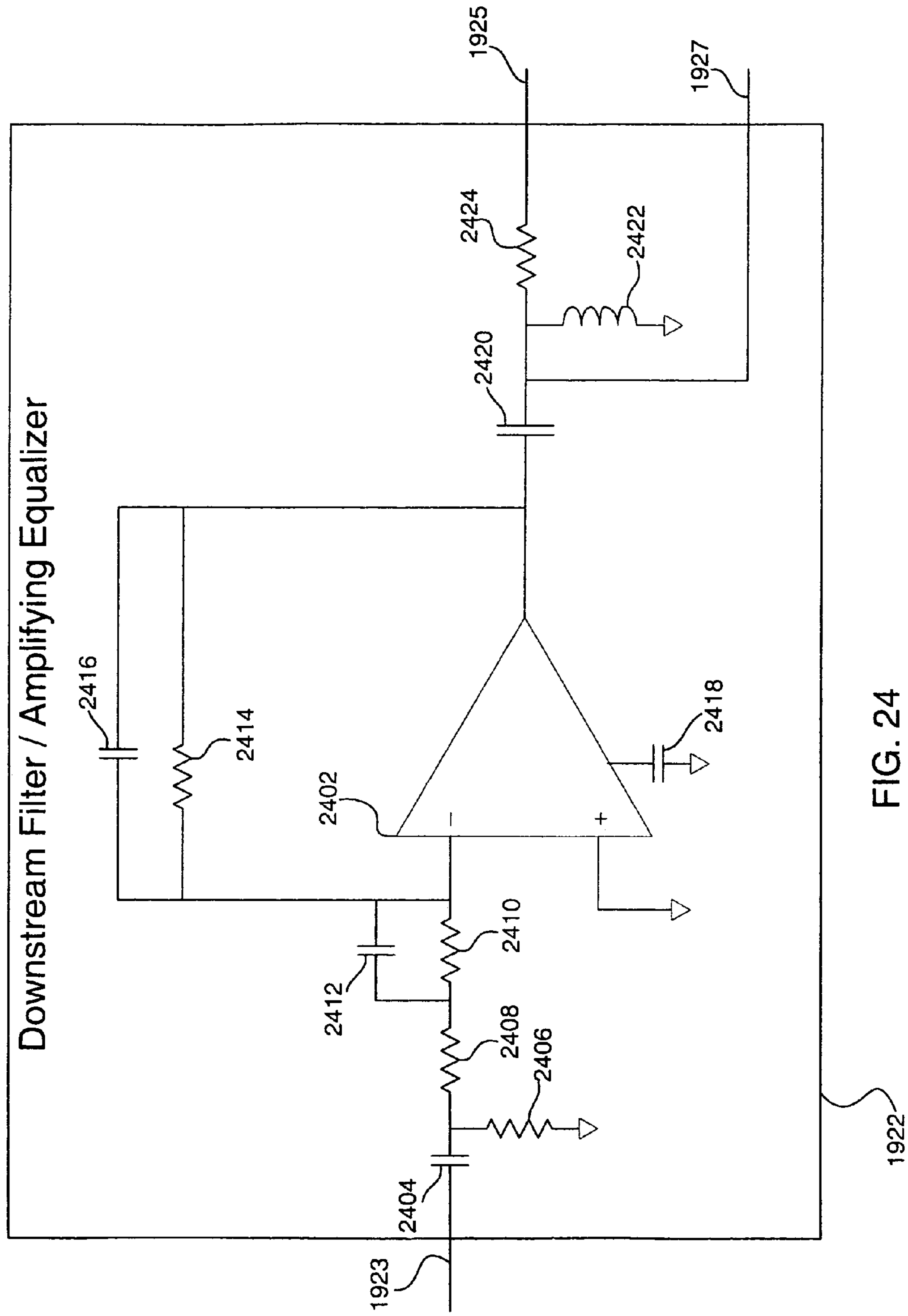
FIG. 24 illustrates one embodiment of the downstream filter/amplifying equalizer of the FIG. 19 loop extender, according to the invention.

FIG. 24 illustrates one embodiment of the downstream filter/amplifying equalizer 1922 of FIG. 19. As shown, the downstream filter/amplifying equalizer 1922 includes an operational amplifier 2402 and associated components for attenuating signals outside the downstream frequency band, such as signals in the upstream frequency band, and for amplifying signals in the downstream frequency band. The downstream filter/amplifying equalizer 1922 is disposed between the central-office-side hybrid 1902 and the differential amplifier pair 1924. In particular, the FIG. 24 embodiment of the downstream filter/amplifying equalizer 1922 includes a capacitor 2404 (200 pF), a resistor 2406 (500 ohms) coupled to ground, a resistor 2408 (500 ohms), a resistor 2410 (1100 ohms), a capacitor 2412 (470 pF), a capacitor 2416 (2.5 pF), a compensation capacitor 2418 (10 pF) coupled to ground, and a resistor 2414 (23000 ohms). The compensation capacitor 2418 stabilizes the operation amplifier 2402 for the desired gain and frequency response.

Additional components of the downstream filter/amplifying equalizer 1922 collectively function as a high pass filter to permit passage of the downstream DSL signals, while attenuating lower frequency signals in the upstream band. The components include a capacitor 2420 (470 pF), an inductor 2422 (1 mH) coupled to ground, and a resistor 2424 (800 ohms). As shown, the line 1925 is coupled to the downstream filter/amplifying equalizer 1922 at the resistor 2424 and the line 1927 is coupled to the downstream filter/amplifying equalizer 1922 between the capacitor 2420 and the resistor 2422. In this configuration, the downstream filter amplifying equalizer 1922 amplifies downstream DSL signals, attenuates signals in the upstream frequency band that may have leaked through the hybrid 1902, and passes the amplified and filtered downstream signals to the differential amplifier pair 1924 along the lines 1925 and 1927.

Figure 25:
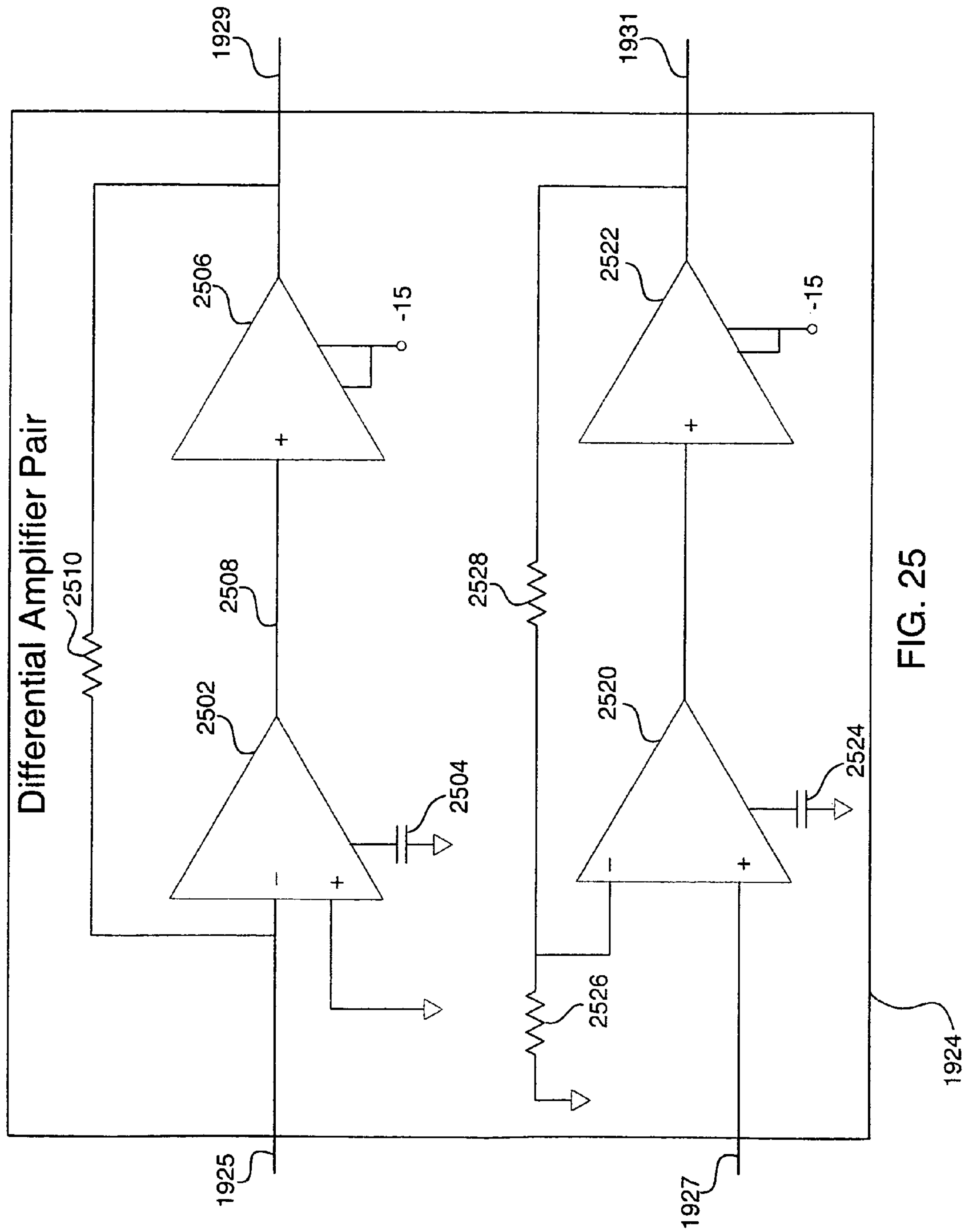
FIG. 25 illustrates one embodiment of the downstream differential amplifier pair of the FIG. 19 loop extender, according to the invention.

FIG. 25 illustrates one embodiment of the differential amplifier pair 1924 of FIG. 19. As shown, the differential amplifier pair 1924 is disposed between the downstream filter/amplifying equalizer 1922 and hybrid 1904 to provide additional amplification to the downstream DSL signals. The illustrated embodiment of the differential amplifier pair 1924 includes an operational amplifier 2502 coupled to the line 1925 at a negative input and coupled to ground at a positive input. The operational amplifier 2502 is also coupled to ground via a compensation capacitor 2504 (10 pF). The compensation capacitor 2504 (10 pF) stabilizes the operation amplifier 2502 for the desired gain and frequency response. The output of the operational amplifier 2502 is coupled to a positive input of an operational amplifier 2506 along line 2508. The output of the operational amplifier 2506 is coupled to the line 1929. The operational amplifier 2506 is configured such that the bias current is set to its highest current setting. In addition, a resistor 2510 (5000 ohms) is disposed between the line 1925 and the line 1929.

Operational amplifiers 2520 and 2522 are disposed between the lines 1927 and 1931. The additional components associated with the operational amplifiers 2520 and 2522 include a compensation capacitor 2524 (10 pF) coupled to ground, a resistor 2526 (500 ohms) coupled to ground, and a resistor 2528 (2600 ohms). In particular, the line 1927 is coupled to a positive input of the operational amplifier 2520 and the resistor 2526 is coupled to a negative input of the operational amplifier 2520. The compensation capacitor 2524 (10 pF) stabilizes the operation amplifier 2520 for the desired gain and frequency response. The output of the operational amplifier 2520 is coupled to a positive input of the operational amplifier 2522. The output of the operational amplifier 2522 is coupled to the line 1931. The operational amplifier 2522 is configured such that the bias current is set to its highest current setting. Lastly, the resistor 2528 is disposed between the negative input of the operational amplifier 2520 and the line 1931.

Figure 26:
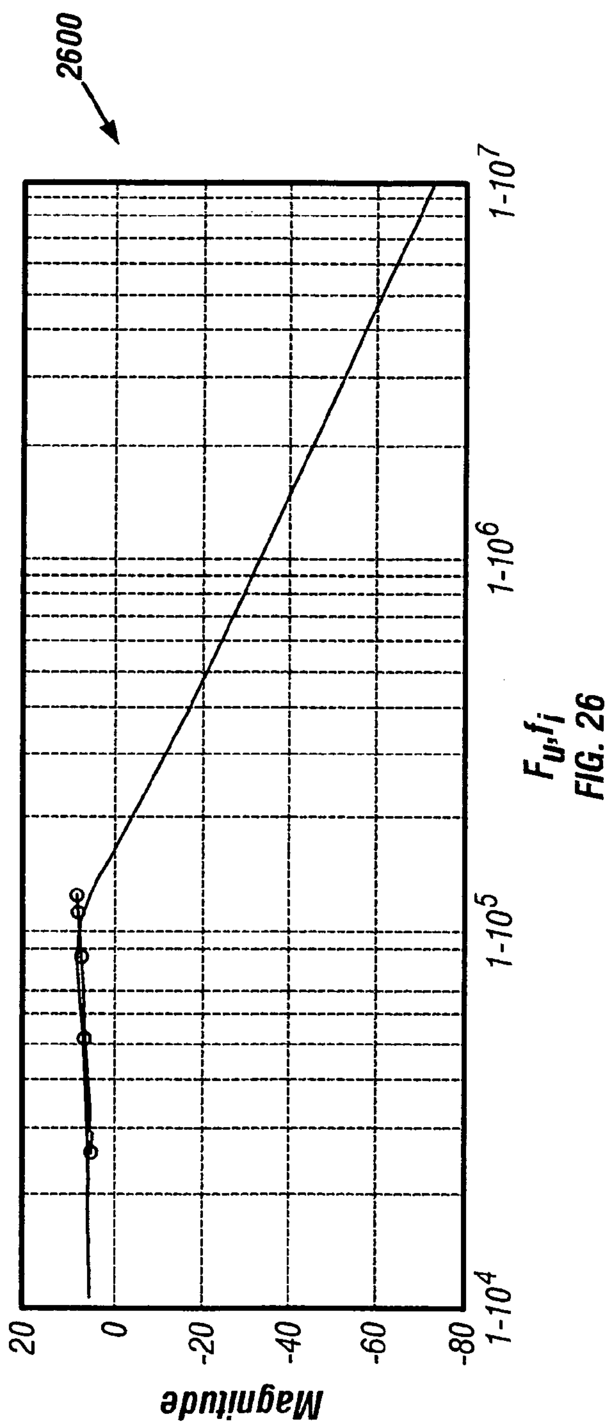
FIG. 26 illustrates the magnitude of the frequency response of the upstream filter/amplifying equalizer of the FIG. 19 loop extender, according to the invention.
Figure 27:
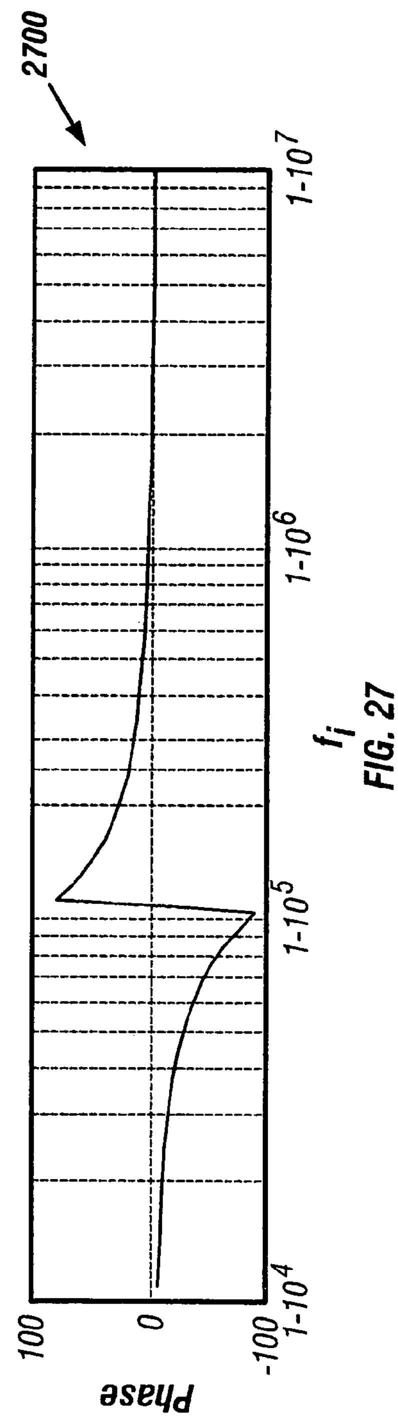
FIG. 27 illustrates the phase of the frequency response of the upstream filter/amplifying equalizer of the FIG. 19 loop extender, according to the invention.

FIG. 26 illustrates the magnitude of the frequency response of the upstream filter/amplifying equalizer 1912 of FIG. 19. As shown, the upstream filter/amplifying equalizer 1912 amplifies signals in the upstream frequency band of about 25–120 kHz and attenuates signals in the downstream frequency band. FIG. 26 also shows that the upstream filter/amplifying equalizer 1912 provides more amplification to higher frequency upstream band signals than to lower upstream band signals. FIG. 27 illustrates the phase of the frequency response of the upstream filter/amplifying equalizer 1912 and shows the pole location.

Figure 28:
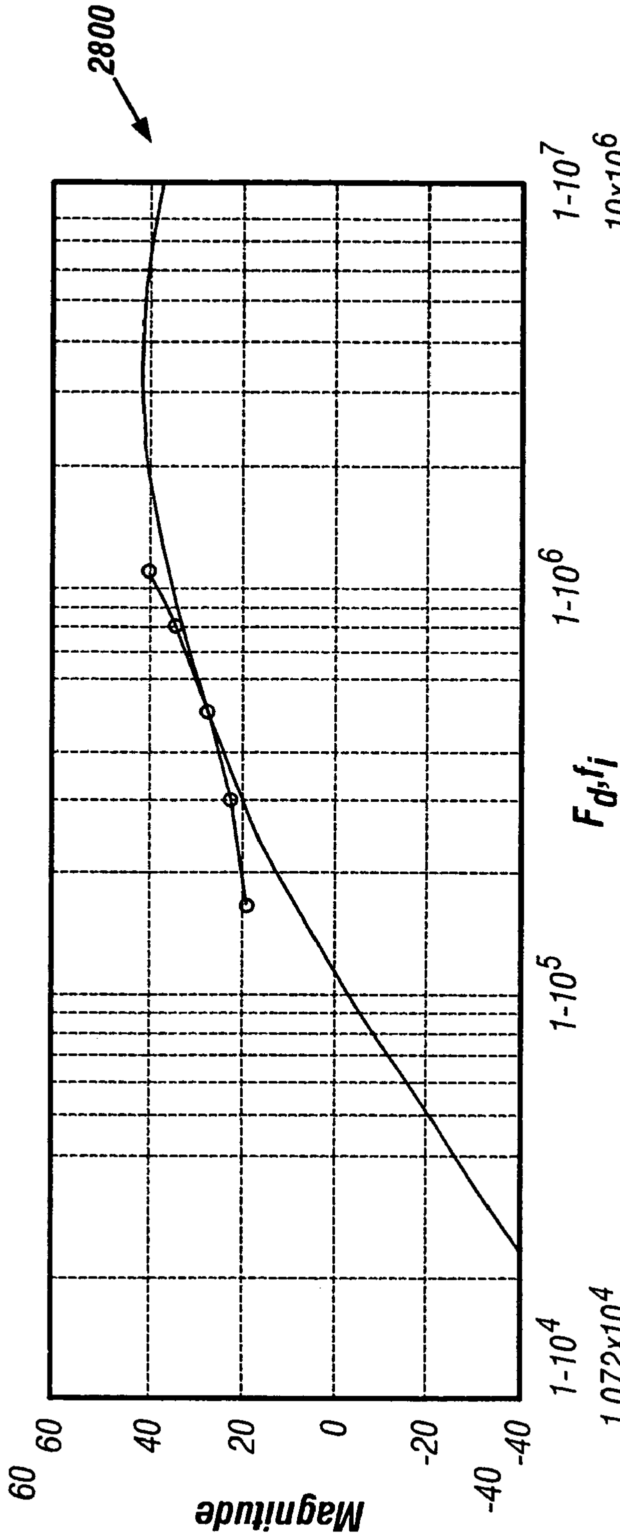
FIG. 28 illustrates the magnitude of the frequency response of the downstream filter/amplifying equalizer of the FIG. 19 loop extender, according to the invention.
Figure 29:
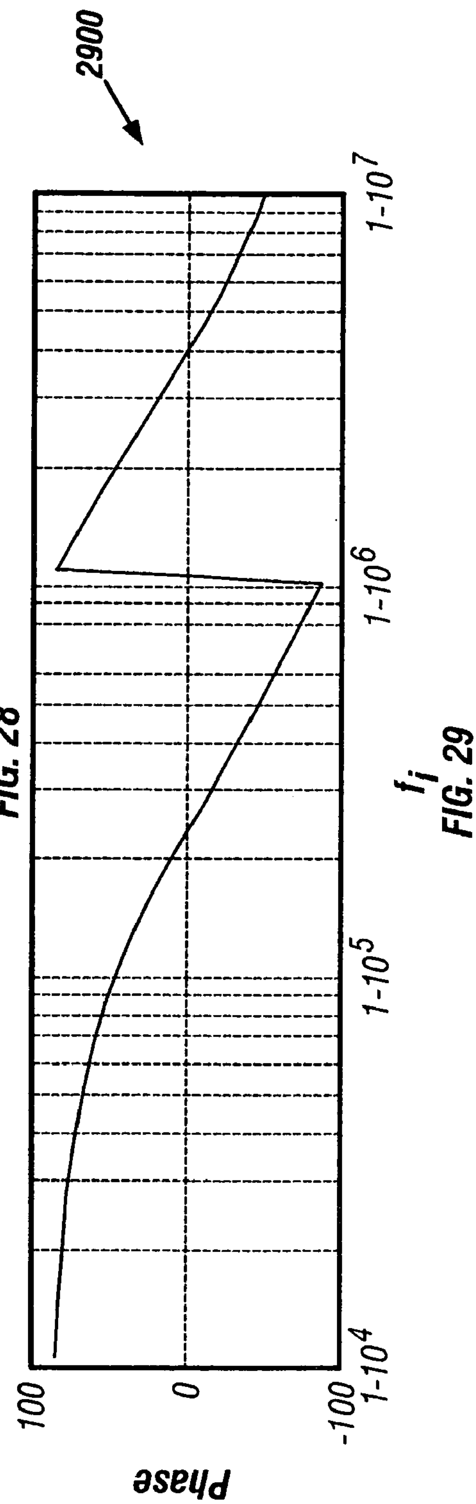
FIG. 29 illustrates the phase of the frequency response of the downstream filter/amplifying equalizer of the FIG. 19 loop extender, according to the invention.

FIG. 28 illustrates the magnitude of the frequency response of the downstream filter/amplifying equalizer 1922 of FIG. 19. As shown, the downstream filter/amplifying equalizer 1922 amplifies signals in the downstream frequency band of about 150 kHz –1.1 MHz while attenuating signals in the upstream frequency band. FIG. 28 also shows that the downstream filter/amplifying equalizer 1922 provides more amplification to higher frequency downstream band signals than to lower frequency downstream band signals. FIG. 29 illustrates the phase of the frequency response of the downstream filter/amplifying equalizer 1912 and shows the pole location.

The present system and method for amplifying DSL signals as they traverse a local loop to overcome, or substantially alleviate, problems associated with DSL signal attenuation may be useful in connection with DSL frequency ranges that extend well above 1.1 MHz. That is, conventionally, the upper bound of DSL signals is typically about 1.1 MHz. This 1.1 MHz upper bound exists, in large part, due to signal attenuation problems; DSL signals significantly above 1.1 MHz are usually too severely attenuated to be useful in many configurations and loop lengths. However, by boosting the amplitude of the DSL signals as disclosed herein, higher frequency DSL signals, such as those significantly above 1.1 MHz, may be employed to enlarge the downstream frequency band, to enlarge the upstream frequency band, or both, to thereby increase the associated downstream and upstream data rates. Indeed, this loop extender technology may enable extensions to current ADSL standards such as T1.413 i2 or G.992.1 that could utilize more bandwidth than the currently defined standards by using higher frequency DSL signals, such as those significantly above 1.1 MHz.

The invention has been described above with reference to specific embodiments. It will, however, be evident that various modifications and changes may be made thereto without departing from the broader spirit and scope of the invention. The foregoing description and drawings are, accordingly, to be regarded in an illustrative rather than a restrictive sense.

What is claimed is:

1. A loop extender adapted to be coupled to a local loop for improving transmission of downstream and upstream DSL signals over the local loop, the downstream DSL signals traversing the local loop in a downstream direction and having a downstream frequency band, and the upstream DSL signals traversing the local loop in an upstream direction and having an upstream frequency band, the loop extender comprising:

a first hybrid coupled to the local loop for receiving downstream DSL signals transmitted over the local loop;

a downstream filter/amplifying equalizer coupled to the first hybrid for amplifying the downstream frequency band components of downstream DSL signals received by the first hybrid, and attenuating other components outside the downstream frequency band that may have leaked through the first hybrid;

a differential amplifier pair coupled to the downstream filter/amplifying equalizer for further amplifying the downstream DSL downstream frequency band components;

a second hybrid coupling the differential amplifier pair to the local loop, the second hybrid differentially amplifying the downstream frequency band components of downstream DSL signals and passing the differentially amplified downstream DSL signals to the local loop;

an upstream filter/amplifying equalizer coupled to the second hybrid for amplifying the upstream frequency band components of upstream DSL signals received by the second hybrid, attenuating the downstream frequency band components of upstream DSL signals received by the second hybrid, and passing the attenuated and amplified upstream DSL signals to the first hybrid; and an inverting amplifier coupled to the upstream filter/amplifying equalizer for inverting the attenuated and amplified upstream DSL signals and passing the inverted and amplified upstream DSL signals to the first hybrid.

2. The loop extender of claim 1, wherein the downstream filter/amplifying equalizer is configured to amplify higher frequency components of the downstream frequency band of downstream DSL signals more than lower frequency components of the downstream frequency band of downstream DSL signals.

3. The loop extender of claim 1, wherein the upstream filter/amplifying equalizer is configured to amplify higher frequency components of the upstream frequency band of upstream DSL signals more than lower frequency components of the upstream frequency band of upstream DSL signals.

4. The loop extender of claim 1, further comprising POTS loading coils adapted to be coupled to the local loop for improving transmission of POTS band signals over the local loop.

5. The loop extender of claim 1, wherein the downstream and upstream DSL signals include VDSL signals.

6. The loop extender of claim 1, wherein the downstream and upstream DSL signals include Category I ADSL signals.

7. The loop extender of claim 1, wherein the downstream frequency band includes frequencies between about 150 kHz –1.104 MHz and the upstream frequency band includes frequencies between about 25–120 kHz.

8. A device for amplifying DSL signals on a local loop, the DSL signals having a downstream frequency band and an upstream frequency band, the device comprising:

a downstream filter/amplifying equalizer coupled to the local loop for amplifying downstream frequency band DSL signals and for attenuating upstream frequency band DSL signals;

an upstream filter/amplifying equalizer coupled to the local loop for amplifying upstream frequency band DSL signals and for attenuating downstream frequency band DSL signals;

a set of POTS loading coils adapted to be coupled to the local loop for improving transmission of POTS band signals over the local loop; and a differential amplifier pair coupled to the downstream filter/amplifying equalizer for further amplifying downstream frequency band DSL signals received from the downstream filter/amplifying equalizer; and an inverting amplifier coupled to the upstream filter/amplifying equalizer for inverting upstream frequency band DSL signals received from the upstream filter/amplifying equalizer.

9. The device of claim 8, further comprising:

a first hybrid coupled to the downstream filter/amplifying equalizer, the inverting amplifier, and the upstream filter/amplifying equalizer for coupling the downstream filter/amplifying equalizer, the inverting amplifier, and the upstream filter/amplifying equalizer to the local loop; and a second hybrid coupled to the upstream filter/amplifying equalizer and the differential amplifier pair for coupling the upstream filter/amplifying equalizer and the differential amplifier pair to the local loop.

10. The device of claim 9, wherein the first hybrid differentially amplifies the upstream frequency band DSL signals received from the inverting amplifier and the upstream filter/amplifying equalizer, and passes the differentially amplified upstream frequency band DSL signals to the local loop.

11. The device of claim 9, wherein the second hybrid differentially amplifies the downstream frequency band DSL signals received from the differential amplifier pair, and passes the differentially amplified downstream frequency band DSL signals to the local loop.

12. The device of claim 8, wherein the downstream filter/amplifying equalizer is configured to amplify higher frequency components of the downstream frequency band DSL signals more than lower frequency components of the downstream frequency band DSL signals, and the upstream filter/amplifying equalizer is configured to amplify higher frequency components of the upstream frequency band DSL signals more than lower frequency components of the upstream frequency band DSL signals.

13. A loop extender adapted to be coupled to a local loop for improving DSL performance over the local loop, the loop extender comprising:

a first hybrid for receiving downstream DSL signals from a central office over the local loop;

a second hybrid for receiving upstream DSL signals from a customer premises over the local loop;

a downstream filter/amplifying equalizer coupled to the first hybrid for receiving downstream DSL signals from the first hybrid, and attenuating upstream frequency band components of downstream DSL signals and amplifying downstream frequency band components of downstream DSL signals;

a differential amplifier pair coupled to the downstream filter/amplifying equalizer for receiving attenuated and amplified downstream DSL signals from the downstream filter/amplifying equalizer and for further amplifying the downstream frequency band components of downstream DSL signals, the differential amplifier pair being coupled to the second hybrid;

an upstream filter/amplifying equalizer coupled to the second hybrid for receiving upstream DSL signals from the second hybrid, and attenuating downstream frequency band components of upstream DSL signals and amplifying upstream frequency band components of upstream DSL signals; and an inverting amplifier coupled to the upstream filter/amplifying equalizer for receiving attenuated and amplified upstream DSL signals from the upstream filter/amplifying equalizer and inverting the upstream frequency band components of the attenuated and amplified upstream DSL signals, the inverting amplifier being coupled to the upstream filter/amplifying equalizer and the first hybrid, and wherein the first hybrid differentially amplifies the upstream frequency band components received from the inverting amplifier, and passes the differentially amplified upstream DSL signals to the local loop.

14. The loop extender of claim 13, wherein:

the first hybrid is configured to differentially amplify the inverted upstream DSL signals received from the inverting amplifier and the attenuated and amplified upstream DSL signals received from the upstream filter/amplifying equalizer, and pass the differentially amplified upstream DSL signals to the local loop for transmission to the central office; and the second hybrid is configured to differentially amplify the amplified downstream DSL signals received from the differential amplifier pair, and pass the differentially amplified downstream DSL signals to the local loop for transmission to the customer premises.

15. The loop extender of claim 13, further comprising POTS loading coils adapted to be coupled to the local loop for improving transmission of POTS band signals over the local loop.

16. The loop extender of claim 13, wherein the upstream and downstream DSL signals include ADSL signals.

17. The loop extender of claim 13, wherein the upstream and downstream DSL signals include VDSL signals.

18. The loop extender of claim 13, wherein the downstream filter/amplifying equalizer is configured to amplify higher frequency components of the downstream frequency band DSL signals more than lower frequency components of the downstream frequency band DSL signals, and the upstream filter/amplifying equalizer is configured to amplify higher frequency components of the upstream frequency band DSL signals more than lower frequency components of the upstream frequency band DSL signals.

19. A method for improving DSL service over a local loop, comprising:

receiving an upstream DSL signal from a customer premises;

filtering the upstream DSL signal to attenuate signals outside an upstream DSL signal frequency band;

amplifying the filtered upstream DSL signal to at least partially compensate for upstream DSL signal attenuation caused by the upstream DSL signal passing over the local loop;

inverting the amplified upstream DSL signal using an inverting amplifier; and differentially amplifying the inverted amplified upstream DSL signal using a first hybrid to further compensate for upstream DSL signal attenuation caused by the upstream DSL signal passing over the local loop; and passing the differentially amplified upstream DSL signal onto the local loop for transmission to a central office.

20. A system for improving DSL service over a local loop, comprising:

means for receiving an upstream DSL signal from a customer premises at a location along the local loop;

means for filtering the upstream DSL signal to attenuate signals outside an upstream DSL signal frequency band;

means for amplifying the filtered upstream DSL signal to at least partially compensate for upstream DSL signal attenuation caused by the upstream DSL signal passing over the local loop;

means for inverting the amplified upstream DSL signal using an inverting amplifier; and means for differentially amplifying the amplified upstream DSL signal and the inverted amplified upstream DSL signal using a first hybrid to further compensate for upstream DSL signal attenuation caused by the upstream DSL signal passing over the local loop; and means for passing the differentially amplified upstream DSL signal onto the local loop for transmission to a central office.

21. A device for amplifying DSL signals on a local loop, the DSL signals having a downstream frequency band and an upstream frequency band, the device comprising:

a downstream filter/amplifying equalizer coupled to the local loop for amplifying downstream frequency band DSL signals and for attenuating upstream frequency band DSL signals;

an upstream filter/amplifying equalizer coupled to the local loop for amplifying upstream frequency band DSL signals and for attenuating downstream frequency band DSL signals;

a differential amplifier pair coupled to the downstream filter/amplifying equalizer for further amplifying downstream frequency band DSL signals received from the downstream filter/amplifying equalizer;

an inverting amplifier coupled to the upstream filter/amplifying equalizer for inverting upstream frequency band DSL signals received from the upstream filter/amplifying equalizer;

a first hybrid coupled to the downstream filter/amplifying equalizer, the inverting amplifier, and the upstream filter/amplifying equalizer for coupling the downstream filter/amplifying equalizer, the inverting amplifier, and the upstream filter/amplifying equalizer to the local loop, wherein the first hybrid differentially amplifies the upstream frequency band DSL signals received from the inverting amplifier and the upstream filter/amplifying equalizer, and passes the differentially amplified upstream frequency band DSL signals to the local loop; and a second hybrid coupled to the upstream filter/amplifying equalizer and the differential amplifier pair for coupling the upstream filter/amplifying equalizer and the differential amplifier pair to the local loop.

22. A device for amplifying DSL signals on a local loop, the DSL signals having a downstream frequency band and an upstream frequency band, the device comprising:

a downstream filter/amplifying equalizer coupled to the local loop for amplifying downstream frequency band DSL signals and for attenuating upstream frequency band DSL signals;

an upstream filter/amplifying equalizer coupled to the local loop for amplifying upstream frequency band DSL signals and for attenuating downstream frequency band DSL signals;

a differential amplifier pair coupled to the downstream filter/amplifying equalizer for further amplifying downstream frequency band DSL signals received from the downstream filter/amplifying equalizer;

an inverting amplifier coupled to the upstream filter/amplifying equalizer for inverting upstream frequency band DSL signals received from the upstream filter/amplifying equalizer;

a first hybrid coupled to the downstream filter/amplifying equalizer, the inverting amplifier, and the upstream filter/amplifying equalizer for coupling the downstream filter/amplifying equalizer, the inverting amplifier, and the upstream filter/amplifying equalizer to the local loop; and a second hybrid coupled to the upstream filter/amplifying equalizer and the differential amplifier pair for coupling the upstream filter/amplifying equalizer and the differential amplifier pair to the local loop, wherein the second hybrid differentially amplifies the downstream frequency band DSL signals received from the differential amplifier pair, and passes the differentially amplified downstream frequency band DSL signals to the local loop.

* * * * *